A display apparatus includes: a substrate having a display area and a peripheral area outside the display area; a first conductive layer on the substrate in the peripheral area and comprising a first hole; a second conductive layer on the first conductive layer and overlapping the first conductive layer, the second conductive layer comprising a second hole; a planarization layer extending from the display area to the peripheral area and comprising at least two organic insulating layers between the first conductive layer and the second conductive layer; and a display element on the planarization layer in the display area, wherein a part of a portion of the second conductive layer except for the second hole is in contact with a part of a portion of the first conductive layer except for the first hole.

20 Claims, 42 Drawing Sheets

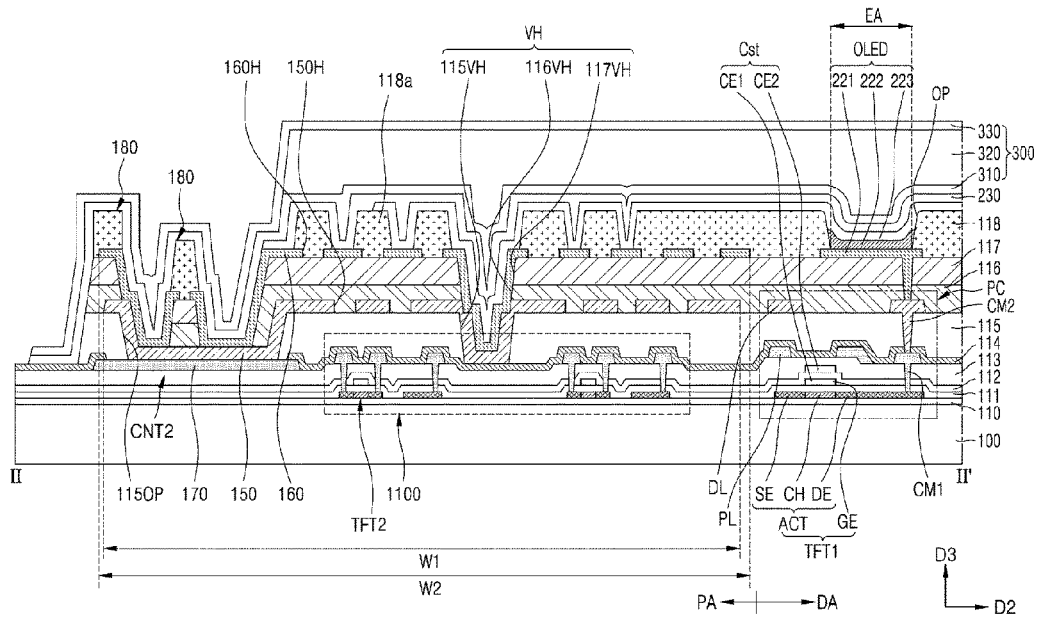

(51) Int. Cl.

| | | |
|---|---|---|
| *H01L 27/32* | (2006.01) | |
| *H01L 27/14* | (2006.01) | |
| *G02F 1/13* | (2006.01) | |
| *G09F 9/30* | (2006.01) | |
| G02F 1/1333 | (2006.01) | |
| G02F 1/1335 | (2006.01) | |
| H01L 27/146 | (2006.01) | |
| G02F 1/1362 | (2006.01) | |

(52) U.S. Cl.
 CPC .. *G02F 1/133331* (2021.01); *G02F 1/133512* (2013.01); *G02F 1/133514* (2013.01); *G02F 1/133528* (2013.01); *G02F 1/136209* (2013.01); *G09F 9/301* (2013.01); *H01L 27/14678* (2013.01); *H01L 27/323* (2013.01); *H01L 27/3211* (2013.01); *H01L 27/3248* (2013.01); *H01L 51/0097* (2013.01); *H01L 51/5246* (2013.01); *H01L 51/5293* (2013.01); *H01L 2251/5338* (2013.01)

(58) Field of Classification Search
 CPC ............. H01L 27/3211; H01L 27/3248; G02F 1/133305; G02F 1/133514; G02F 1/133528; G02F 1/133331; G02F 1/133512; G02F 1/136209; G02F 2001/133357; G09F 9/301
 See application file for complete search history.

(56) References Cited

U.S. PATENT DOCUMENTS

| | | | |
|---|---|---|---|
| 10,210,798 B2 | 2/2019 | Kim et al. | |
| 10,381,592 B2 | 8/2019 | Lee et al. | |
| 10,439,165 B2 | 10/2019 | Kim et al. | |
| 10,879,319 B2* | 12/2020 | Bang | G06F 3/0412 |
| 2018/0138450 A1* | 5/2018 | Park | H01L 51/5256 |
| 2019/0006442 A1* | 1/2019 | Byun | H01L 27/3246 |
| 2019/0074479 A1* | 3/2019 | Lee | H01L 51/5253 |
| 2019/0148469 A1* | 5/2019 | Lhee | H01L 27/3246 |
| | | | 257/40 |
| 2019/0229177 A1* | 7/2019 | Kim | G09G 3/3275 |
| 2019/0237533 A1* | 8/2019 | Kim | G09G 3/3266 |
| 2019/0355930 A1* | 11/2019 | Lee | H01L 51/5256 |
| 2020/0176538 A1* | 6/2020 | Um | H01L 27/3272 |
| 2021/0257424 A1* | 8/2021 | Byun | H01L 51/5253 |

FOREIGN PATENT DOCUMENTS

| | | |
|---|---|---|
| KR | 10-2018-0013452 A | 2/2018 |
| KR | 10-2019-0026351 A | 3/2019 |

* cited by examiner

DISPLAY APPARATUS INCLUDING MULTI-LAYERED PLANARIZATION LAYER

CROSS-REFERENCE TO RELATED APPLICATION

The present application claims priority to and the benefit of Korean Patent Application No. 10-2019-0129329, filed on Oct. 17, 2019, in the Korean Intellectual Property Office, the disclosure of which is incorporated herein in its entirety by reference.

BACKGROUND

1. Field

Aspects of one or more embodiments relate to a display apparatus.

2. Description of Related Art

Recently, the various uses of display apparatuses have become more diversified. Also, as display apparatuses become slimmer and lighter, display apparatuses may be more widely utilized. Research has been conducted to provide, in addition to flat display apparatuses, flexible display apparatuses such as foldable display apparatuses or rollable display apparatuses.

The above information disclosed in this Background section is only for enhancement of understanding of the background and therefore the information discussed in this Background section does not necessarily constitute prior art.

SUMMARY

Aspects of one or more embodiments relate to a display apparatus, and for example, to a foldable display apparatus capable of being folded or curved.

One or more embodiments include a display apparatus having a structure capable of preventing or reducing deterioration in the display quality of images. However, these characteristics are merely examples, and the scope of the disclosure is not limited thereby.

Additional aspects will be set forth in part in the description which follows and, in part, will be more apparent from the description, or may be learned by practice of the presented embodiments of the disclosure.

According to one or more embodiments, a display apparatus includes a substrate including a display area and a peripheral area outside the display area, a first conductive layer arranged on the substrate in the peripheral area and including a first hole, a second conductive layer arranged on the first conductive layer while overlapping the first conductive layer and including a second hole, a planarization layer extending from the display area to the peripheral area and including at least two organic insulating layers arranged between the first conductive layer and the second conductive layer, and a display element arranged on the planarization layer in the display area, wherein a part of a portion of the second conductive layer except for the second hole is in contact with a part of a portion of the first conductive layer except for the first hole.

According to some embodiments, the planarization layer may include a first organic insulating layer including a third hole, and a second organic insulating layer arranged on the first organic insulating layer and including a fourth hole, the second hole of the second conductive layer may be offset from the first hole of the first conductive layer, the third hole of the first organic insulating layer and the fourth hole of the second organic insulating layer may be offset from the first hole of the first conductive layer and the second hole of the second conductive layer, and the second conductive layer may be in contact with the first conductive layer at a position where the third hole of the first organic insulating layer overlaps the fourth hole of the second organic insulating layer.

According to some embodiments, a size of the third hole of the first organic insulating layer may be different from a size of the fourth hole of the second organic insulating layer.

According to some embodiments, the planarization layer may include a first organic insulating layer including an insulating pattern overlapping the first hole of the first conductive layer, and a second organic insulating layer arranged on the first organic insulating layer, the second organic insulating layer may be offset from the first hole of the first conductive layer and the second hole of the second conductive layer and may include a fourth hole arranged around the insulating pattern of the first organic insulating layer, the second hole of the second conductive layer may be offset from the first hole of the first conductive layer, and the second conductive layer may be in contact with the first conductive layer at a position of the fourth hole of the second organic insulating layer.

According to some embodiments, the planarization layer may include a first organic insulating layer including an insulating pattern overlapping the first hole of the first conductive layer, and a second organic insulating layer arranged on the first organic insulating layer, the second organic insulating layer may comprise a fourth hole offset from the first hole of the first conductive layer and the second hole of the second conductive layer, and the fourth hole may be arranged around the insulating pattern of the first organic insulating layer, the second hole of the second conductive layer may overlap the first hole of the first conductive layer, and the second conductive layer may be in contact with the first conductive layer at a position of the fourth hole of the second organic insulating layer.

According to some embodiments, the display element may include a first electrode arranged on a same layer as the second conductive layer, a second electrode facing the first electrode, and an emission layer between the first electrode and the second electrode, and the second electrode may extend to the peripheral area.

According to some embodiments, the display apparatus may further include an insulating layer covering an edge of the first electrode of the display element in the display area and including an insulating pattern overlapping the second hole of the second conductive layer in the peripheral area, wherein the second electrode of the display element may be in contact with the second conductive layer.

According to some embodiments, the display apparatus may further include a thin-film transistor electrically connected to the first electrode of the display element in the display area, and a power supply line arranged in an area between an end portion of the second electrode of the display element and an edge of the substrate in the peripheral area, wherein an end portion of the first conductive layer may be in contact with the power supply line, and an end portion of the second conductive layer may be in contact with the end portion of the first conductive layer.

According to some embodiments, a window above the substrate and the display element may be flexible so that the display area is folded or curved.

According to some embodiments, the planarization layer may include a first organic insulating layer including a first organic material, and a second organic insulating layer including a second organic material that is different from the first organic material.

According to one or more embodiments, a display apparatus includes a substrate including a display area and a peripheral area outside the display area, a first conductive layer arranged on the substrate in the peripheral area and including a first hole, a second conductive layer arranged on the first conductive layer while overlapping the first conductive layer and including a second hole, a first organic insulating layer extending from the display area to the peripheral area and arranged between the first conductive layer and the second conductive layer in the peripheral area, a second organic insulating layer arranged on the first organic insulating layer, a portion of the second organic insulating layer arranged in the peripheral area being removed, and a display element arranged on the second organic insulating layer in the display area, wherein a part of a portion of the second conductive layer except for the second hole is in contact with a part of a portion of the first conductive layer except for the first hole.

According to some embodiments, the second hole of the second conductive layer may overlap the first hole of the first conductive layer, the first organic insulating layer may include an insulating pattern overlapping the first hole of the first conductive layer, and the second conductive layer may be in contact with a portion of the first conductive layer that is not covered with the insulating pattern of the first organic insulating layer.

According to some embodiments, the second hole of the second conductive layer may be offset from the first hole of the first conductive layer, the first organic insulating layer may include a third hole that is offset from the first hole of the first conductive layer and the second hole of the second conductive layer, and the second conductive layer may be in contact with the first conductive layer at a position of the third hole of the first organic insulating layer.

According to some embodiments, the second hole of the second conductive layer may overlap the first hole of the first conductive layer, the first organic insulating layer may include a third hole that is offset from the first hole of the first conductive layer and the second hole of the second conductive layer, and the second conductive layer may be in contact with the first conductive layer at a position of the third hole of the first organic insulating layer.

According to some embodiments, the display element may include a first electrode arranged on the second organic insulating layer, and a second electrode facing the first electrode and extending to the peripheral area.

According to some embodiments, the display apparatus may further include an insulating layer covering an edge of the first electrode of the display element in the display area and including an insulating pattern overlapping the second hole of the second conductive layer in the peripheral area, wherein the second electrode of the display element may be in contact with the second conductive layer.

According to some embodiments, the display apparatus may further include a power supply line arranged between an end portion of the second electrode and an edge of the substrate, wherein an end portion of the first conductive layer may be in contact with the power supply line, and an end portion of the second conductive layer may be in contact with the end portion of the first conductive layer.

According to some embodiments, a window above the substrate and the display element may be flexible so that the display area is folded or curved.

According to some embodiments, the first organic insulating layer may include a first organic material, and the second organic insulating layer may include a second organic material that is different from the first organic material.

According to one or more embodiments, a display apparatus includes a substrate including a display area and a peripheral area outside the display area, a first organic insulating layer arranged on the substrate in the display area and the peripheral area, a first conductive layer arranged on the first organic insulating layer in the peripheral area and including a plurality of first holes, a second organic insulating layer covering the first conductive layer and arranged on the first organic insulating layer, a third organic insulating layer arranged on the second organic insulating layer, a second conductive layer arranged on the third organic insulating layer in the peripheral area and including a plurality of second holes, centers of the plurality of second holes of the second conductive layer being offset from centers of the plurality of first holes of the first conductive layer, and a display element arranged on the third organic insulating layer in the display area.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1A:
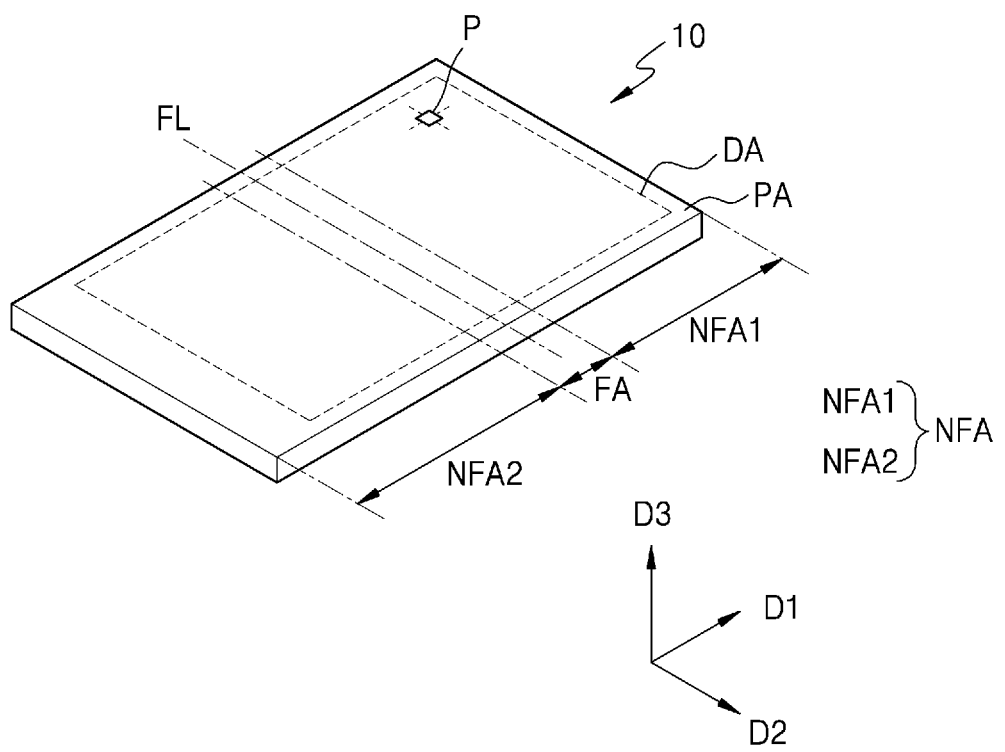
FIGS. 1A and 1B are perspective views schematically illustrating display apparatuses before folding, according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, some embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

It will be understood that although the terms "first," "second," etc. may be used herein to describe various elements, these elements should not be limited by these terms. These terms are only used to distinguish one element from another.

As used herein, the singular forms "a," "an," and "the" are intended to include the plural forms as well, unless the context clearly indicates otherwise.

It will be further understood that the terms "comprises" and/or "comprising" used herein specify the presence of stated features or elements, but do not preclude the presence or addition of one or more other features or elements.

It will be understood that when a layer, region, or element is referred to as being "formed on," another layer, region, or element, it may be directly or indirectly formed on the other layer, region, or element. That is, for example, intervening layers, regions, or elements may be present.

Sizes of elements in the drawings may be exaggerated for convenience of explanation. In other words, because sizes and thicknesses of elements in the drawings are arbitrarily illustrated for convenience of explanation, the following embodiments are not limited thereto.

In this specification, the expression "A and/or B" indicates only A, only B, or both A and B. Throughout the disclosure, the expression "at least one of A or B" indicates only A, only B, or both A and B.

In the following embodiments, the expression "a line extends in a "first direction" or a "second direction" as used herein may include not only a case in which a line extends in a linear shape but also a case in which a line extends in zigzag or a curved shape along the first direction or the second direction.

In the following embodiments, the expression "when seen in a plan view" as used herein may indicate a case in which an object is seen from above, and the expression "when seen in a cross-sectional view" as used herein may indicate a case in which a cross-section obtained by cutting an object vertically is seen from the side. In the following embodiments, the expression "a first element overlaps a second element" may mean that a first element is arranged above or below a second element.

Figure 1B:
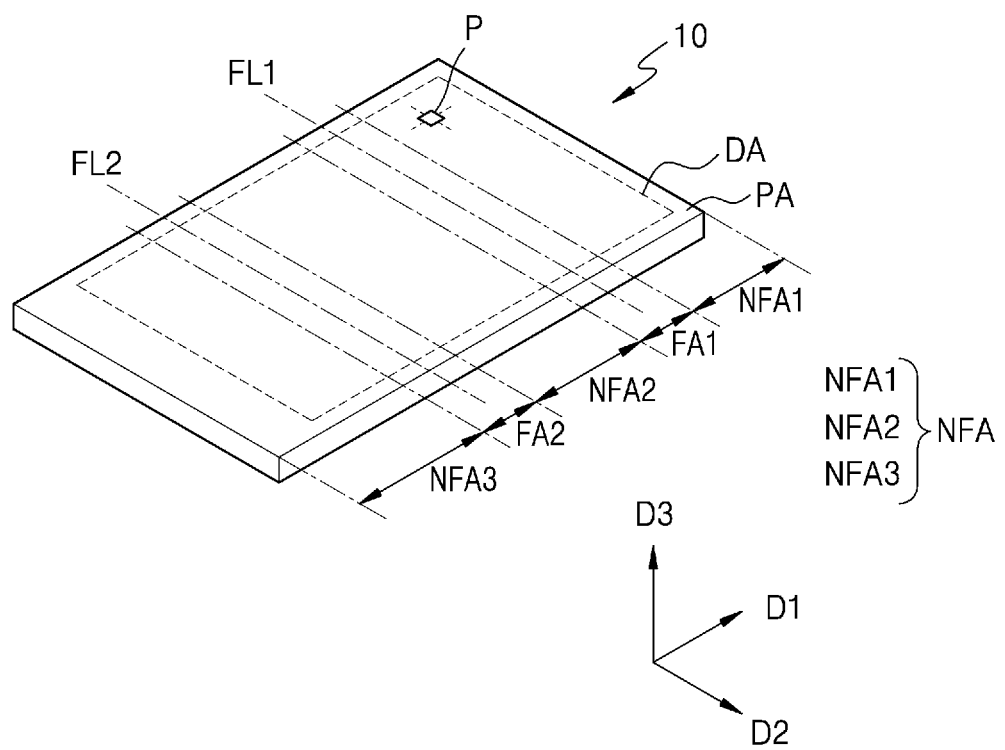
Figure 2A:
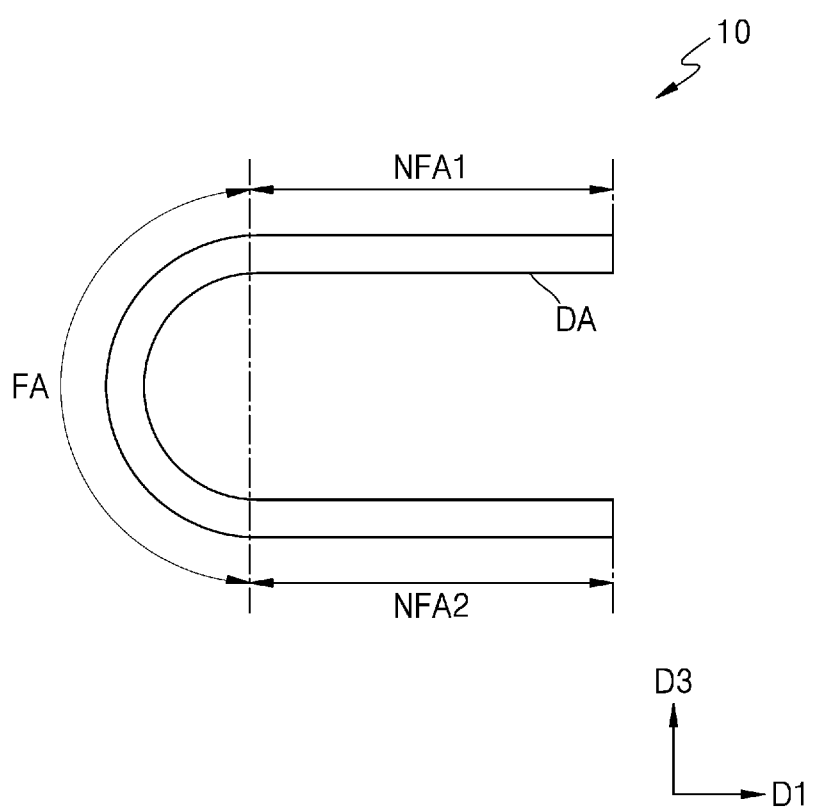
FIGS. 2A and 2B are cross-sectional views schematically illustrating display apparatuses in a folding state, according to some embodiments.
Figure 2B:
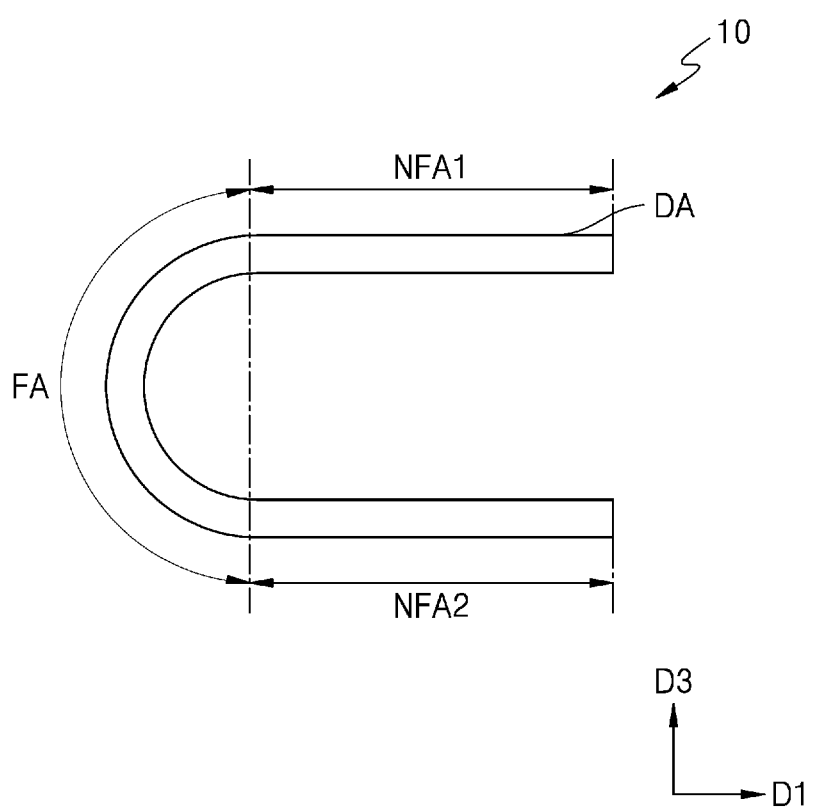
Figure 3A:
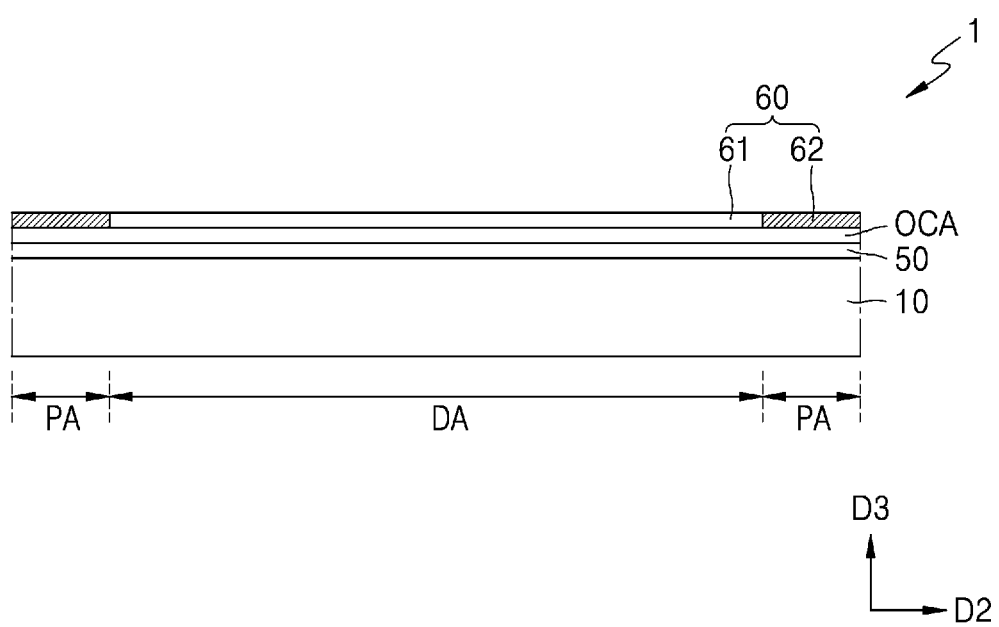
FIGS. 3A and 3B are cross-sectional views of display apparatuses according to some embodiments.
Figure 3B:
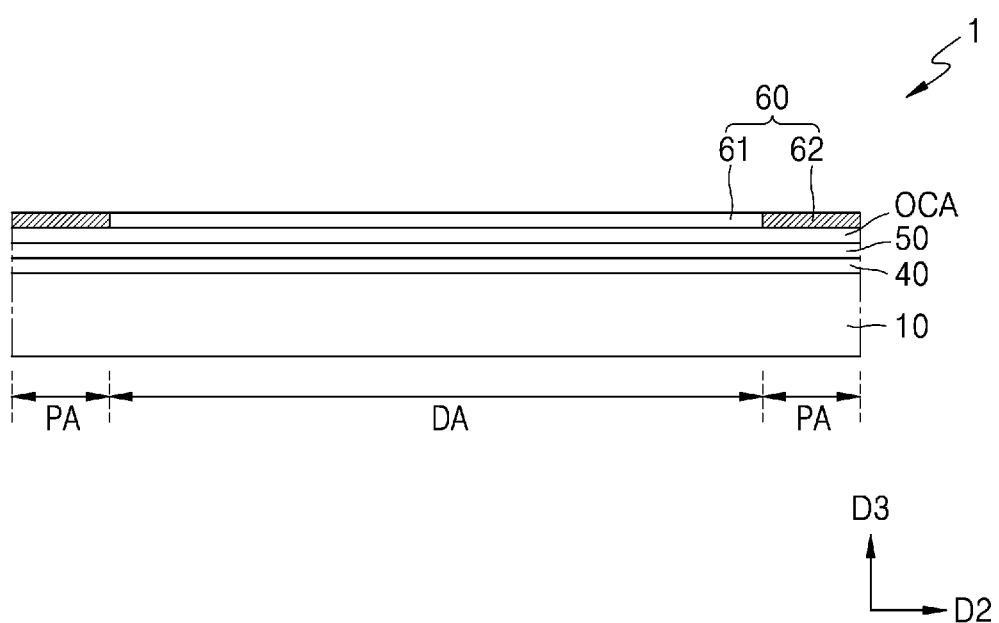

FIGS. 1A and 1B are perspective views schematically illustrating display apparatuses before folding, according to some embodiments. FIGS. 2A and 2B are cross-sectional views schematically illustrating display apparatuses in a folding state, according to some embodiments. FIGS. 3A and 3B are cross-sectional views of display apparatuses according to some embodiments.

The display apparatuses according to some embodiments may be display apparatuses capable of being folded or curved. The display apparatuses may be provided in various shapes. For example, the display apparatuses may be provided in a rectangular plate shape having two pairs of sides or edges that are parallel to each other. When a display apparatus is provided in a rectangular plate shape, one pair of opposing sides among the two pairs of sides may be provided to be longer than the other pair of sides. According to some embodiments, for convenience of description, a display apparatus has a rectangular shape having a pair of long sides and a pair of short sides. In FIG. 1A, for example, an extending direction of the long side is indicated by a first direction D1, an extending direction of the short side is indicated by a second direction D2, and a direction perpendicular to the extending directions of the long side and the short side is indicated by a third direction D3.

The shape of a display apparatus according to some embodiments is not limited to the above-described shape, however, and the display apparatus according to some embodiments may have various shapes. For example, the display apparatus may be provided in various shapes, such as a closed polygon including a straight side, a circle, an ellipse, or the like including a curved side, and a semicircle, a semi-ellipse, or the like including a straight line and a curved line. According to some embodiments, when a display apparatus has a straight side, at least a part of corners of each shape may be curved. For example, when a display apparatus has a rectangular shape, a portion at which adjacent straight sides meet may be replaced with a curve having a certain curvature. That is, a vertex portion of the rectangular shape may have a curved side having both adjacent ends connected to two adjacent straight sides and having a certain curvature. The curvature may be set differently according to a position. For example, the curvature may be changed according to the start position of the curve, the length of the curve, and the like.

Referring to FIGS. 1A, 1B, 2A, and 2B, the display apparatus may include a display panel 10. The display panel 10 may have a display area DA and a peripheral area PA outside the display area DA. The display area DA is an area in which a plurality of pixels P are arranged to display an image. The peripheral area PA surrounds the display area DA and is a non-display area in which no pixels are arranged. For example, the peripheral area PA may be a bezel area.

At least a portion of the display panel 10 may be flexible, and the display panel 10 may be foldable at a flexible portion. That is, the display panel 10 may include a foldable area FA that is flexible and foldable, for example, along an axis (e.g., a set or predetermined axis), and non-folding areas NFA1 and NFA2 that are provided on at least one side of the foldable area FA and which are not foldable. According to some embodiments, the area that is not foldable is referred to as the non-folding area, but this is only for convenience of description. The expression "non-folding" includes a case in which an area is not flexible and is thus rigid, a case in which an area is flexible but is less flexible than the foldable area FA, and a case in which an area is flexible but is not foldable. The display panel 10 may be configured to display an image in the display area DA of the foldable area FA and the non-folding area NFA.

In FIG. 1A, for convenience of description, the first non-folding area NFA1 and the second non-folding area NFA2 are illustrated as having similar areas, and one foldable area FA is illustrated as being located between the first non-folding area NFA1 and the second non-folding area NFA2, but embodiments are not limited thereto. For example, according to some embodiments, the first non-folding area NFA1 and the second non-folding area NFA2 may have different areas. In addition, as illustrated in FIG. 1B, a plurality of foldable areas (e.g., foldable areas FA1 and FA2) may be provided. In this case, a plurality of non-folding areas NFA1, NFA2, and NFA3 may be positioned apart from each other with corresponding ones of the foldable areas FA1 and FA2 therebetween. The foldable areas FA, FA1, and FA2 may be folded based on folding lines FL, FL1, and FL2, respectively, and the folding lines FL, FL1, and FL2 may be provided in plurality, in each foldable areas FA, FA1, and FA2. The folding lines FL, FL1, and FL2 are provided in the foldable areas FA, FA1, and FA2 in the second direction D2 that is the extending direction of the foldable areas FA, FA1, and FA2, respectively. Therefore, the display panel 10 may be folded in the foldable areas FA, FA1, and FA2.

In FIGS. 1A and 1B, the folding lines FL, FL1 and FL2 are illustrated as passing through the centers of the foldable areas FA, FA1, and FA2, and the foldable areas FA, FA1, and FA2 are illustrated as being linearly symmetrical with respect to the folding lines FL, FL1, and FL2, but embodiments are not limited thereto. That is, the folding lines FL, FL1, and FL2 may be provided asymmetrically in the foldable areas FA, FA1, and FA2. The foldable areas FA, FA1, and FA2 and the folding lines FL, FL1, and FL2 of the foldable areas FA, FA1, and FA2 may overlap the area of the display panel 10, where the image is displayed. When the display panel 10 is folded, the portion of the display panel 10, where the image is displayed, may be folded.

According to some embodiments, the display panel 10 may entirely correspond to the foldable area. For example, in the case of the display apparatus that is rollable like a roll of paper, the display panel 10 may entirely correspond to the foldable area.

As illustrated in FIGS. 1A and 1B, the display panel 10 may be unfolded to be flat as a whole. According to some embodiments, as illustrated in FIG. 2A, the display panel 10 may be folded based on the folding line FL so that different portions of the display area DA face each other. According to some embodiments, as illustrated in FIG. 2B, the display panel 10 may be folded along a folding line FL (or along a folding area FA) so that the display areas DA face the outside. The term "folded" does not mean that the form is fixed, but may mean that the form is modified from an original form to another form. The term "folded" includes the form of being folded along one or more specific lines, that is, the folding line FL, curved, or rolled like a roll of paper. Therefore, according to some embodiments, one surface of each of the two non-folding areas NFA1 and NFA2 is illustrated as being arranged in parallel to each other and folded to face each other, but embodiments are not limited thereto. The surfaces of the two non-folding areas NFA1 and NFA2 may be folded at a certain angle (for example, an acute angle, a right angle, or an obtuse angle) with the foldable area FA therebetween.

Referring to FIG. 3A, the display apparatus 1 may include an optical function layer 50 on the display panel 10, and the display panel 10 and the optical function layer 50 may be covered with a window 60. The window 60 may be bonded to an underlying element, for example, the optical function layer 50, through an adhesive layer such as an optical clear adhesive (OCA). The display apparatus 1 may be utilized in various electronic apparatuses such as a mobile phone, a tablet personal computer (PC), a notebook computer, and a smart watch. As illustrated in FIG. 3B, the display apparatus 1 may further include an input sensing layer 40 between the display panel 10 and the optical function layer 50.

The input sensing layer 40 acquires coordinate information according to an external input, for example, a touch event (e.g., from a user's body or finger, a stylus, or the like). The input sensing layer 40 may include a sensing electrode (or a touch electrode) and signal lines (or trace lines) connected to the sensing electrode. According to some embodiments, the input sensing layer 40 may be directly arranged on the display panel 10. The expression "the input sensing layer 40 is directly arranged on the display panel 10" may refer to a state in which no separate adhesive material layer is arranged between the input sensing layer 40 and the display panel 10, and may mean that elements of the input sensing layer 40 are directly patterned on the display panel 10. According to some embodiments, the input sensing layer 40 may be formed in a process separate from the display panel 10 and then bonded to the display panel 10 by using a transparent adhesive material layer or the like.

The optical function layer 50 may include a structure of a black matrix and color filters. The color filters may be arranged according to the color of light emitted from each pixel of the display panel 10. The optical function layer 50 may function as an antireflective layer that reduces the reflectance of light (external light) incident from the outside toward the display panel 10 through the window 60.

The window 60 may cover and protect the optical function layer 50, the input sensing layer 40, and/or the display panel 10. The window 60 may be provided on the display panel 10 without a polarization layer to reduce the reflectance of external light arranged between the display panel 10 and the window 60. Aspects of some embodiments may include a foldable display apparatus that may be enabled to prevent or reduce external light reflection by including the optical function layer 50 including a color filter instead of a rigid polarization layer (for example, a retarder and a polarizer) and/or a planarization layer including a plurality of organic insulating layers in the display panel 10.

According to some embodiments, the window 60 may be formed to be larger than the input sensing layer 40, the optical function layer 50, and the display panel 10, so that the side of the window 60 protrudes more than the side of each of the input sensing layer 40, the optical function layer 50, and the display panel 10. The window 60 may include a transparent material. The window 60 may be flexible. For example, the window 60 may include a polymer resin, such as polyethersulfone (PES), polyacrylate (PAR), polyetherimide (PEI), polyethylene naphthalate (PEN), polyethylene terephthalate (PET), polyphenylene sulfide (PPS), polyimide (PI), polycarbonate (PC), cellulose triacetate (TAC), or cellulose acetate propionate (CAP). The window 60 may be bonded on the input sensing layer 40 and the optical function layer 50 by using a transparent adhesive material layer or the like. The window 60 may include a light transmitting area 61 corresponding to the display area DA and a light blocking area 62 corresponding to the peripheral area PA.

Figure 4A:
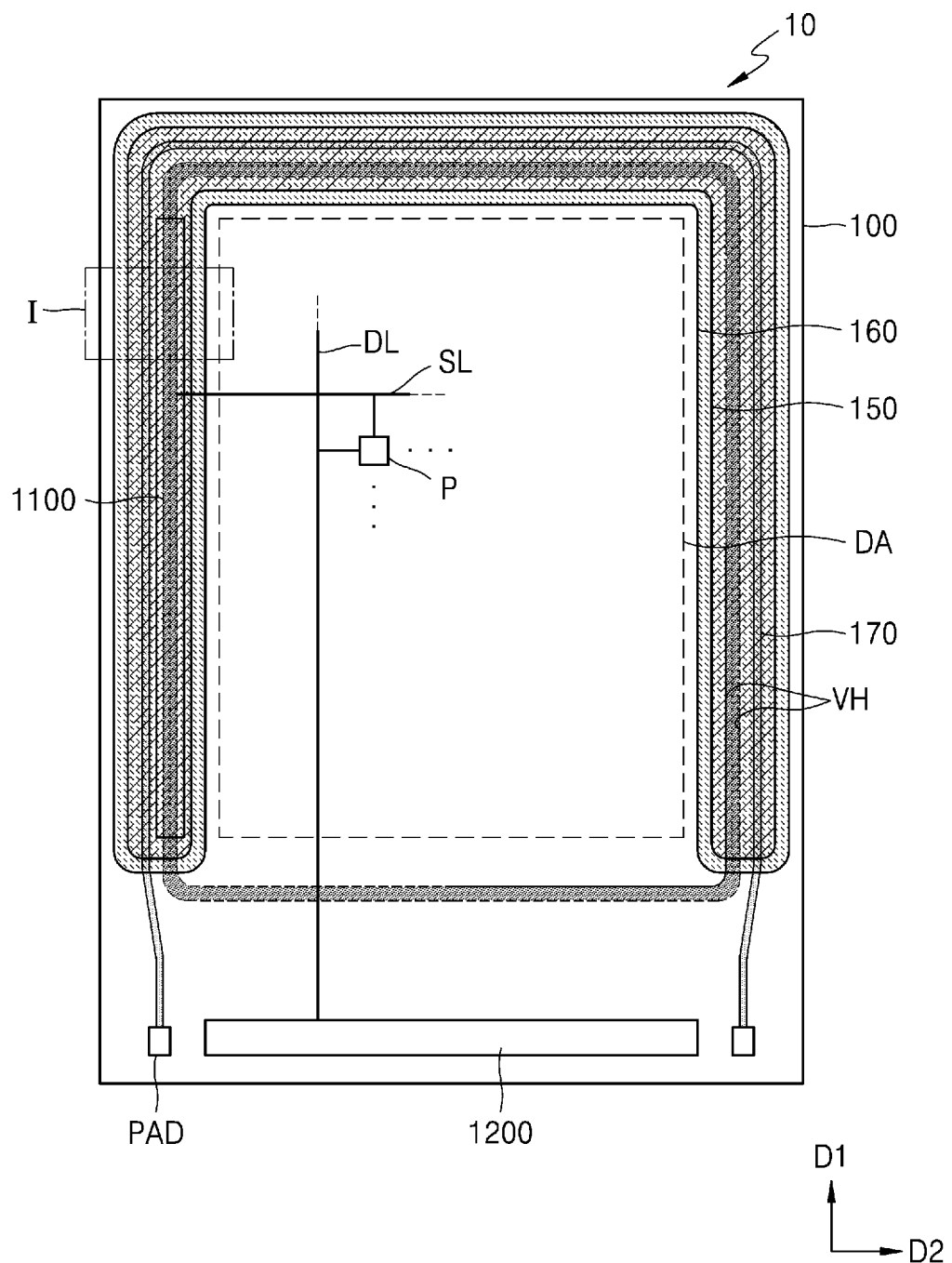
FIGS. 4A and 4B are plan views schematically illustrating peripheral areas of display panels, according to some embodiments.
Figure 4B:
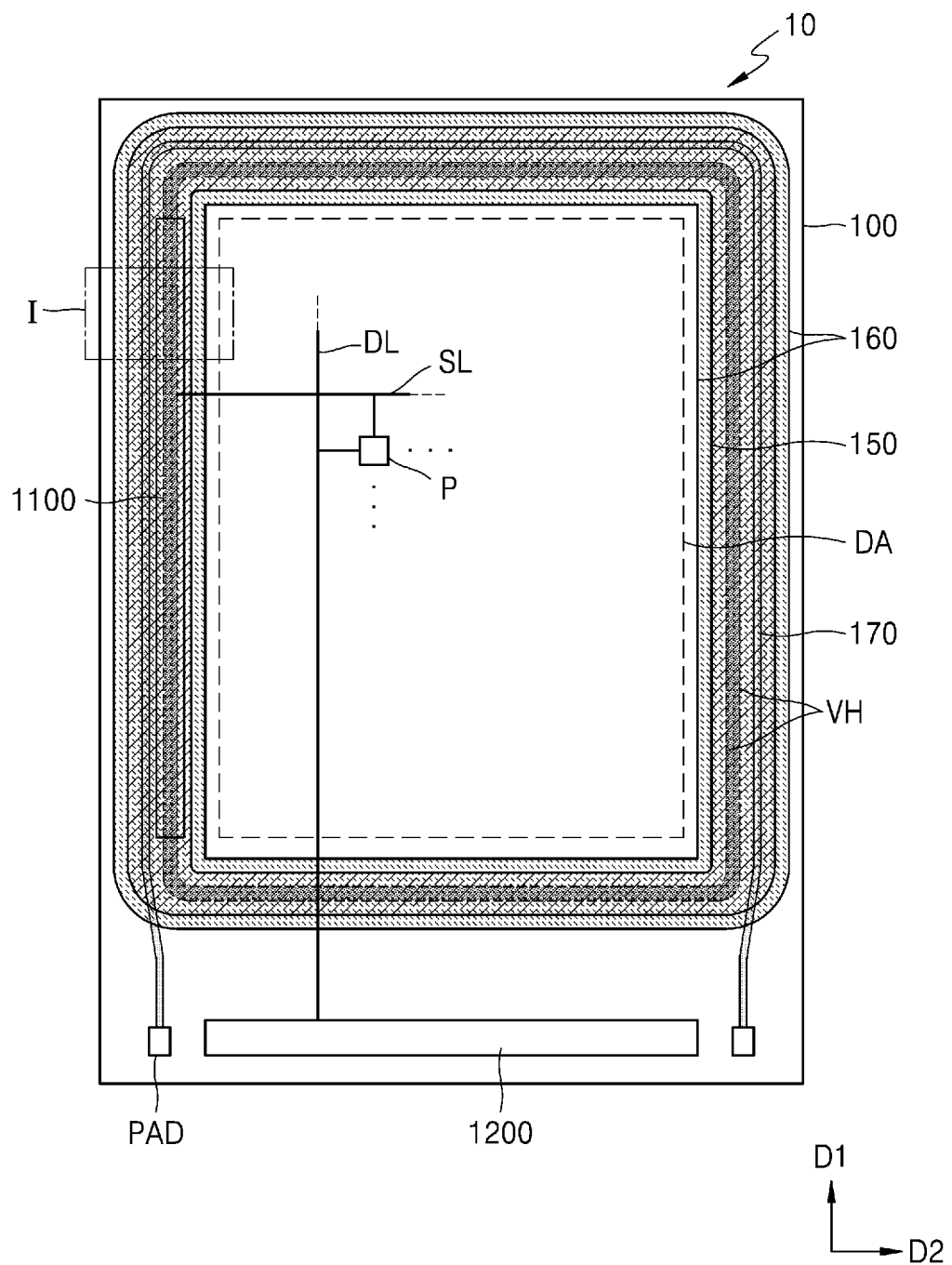

FIGS. 4A and 4B are plan views schematically illustrating peripheral areas of display panels, according to some embodiments.

Referring to FIG. 4A, the display panel 10 according to some embodiments includes a substrate 100 having a display area DA and a peripheral area PA outside the display area DA. A plurality of pixels P and signal lines configured to apply electrical signals to the pixels P may be arranged in the display area DA.

The pixels P may each include a display element and a pixel circuit that drives the display element. For example, the display element may include an organic light-emitting diode, and the pixel circuit may include a plurality of transistors and a capacitor. The pixels P may include first pixels that emit light of a first color, second pixels that emit light of a second color, and third pixels that emit light of a third color. For example, the first pixel may be a red pixel (R), the second pixel may be a green pixel (G), and the third pixel may be a blue pixel (B).

The signal lines configured to apply the electrical signals to the pixels P may include a plurality of scan lines SL, a plurality of data lines DL, and the like. Each of the data lines DL may extend in the first direction D1, and each of the scan lines SL may extend in the second direction D2. For example, the scan lines SL are arranged in a plurality of rows to transmit scan signals to the pixels P, and the data lines DL may be arranged in a plurality of columns to transmit data signals to the pixels P. Each of the pixels P may be connected to at least one corresponding scan line SL among the scan lines SL and a corresponding data line DL among the data lines DL.

The peripheral area PA may surround the display area DA. The peripheral area PA is an area in which no pixels P are arranged. Various electronic devices, printed circuit boards, and the like may be electrically attached to the peripheral area PA, and voltage lines configured to supply power for driving the display elements may be arranged in the peripheral area PA. For example, a scan driver 1100 that provides a scan signal to each pixel P, a data driver 1200 that provides a data signal to each pixel P, signal supply lines (a clock signal line, a carry signal line, a driving voltage line, and the like) configured to supply signals to the scan driver 1100 and the data driver 1200, and main voltage lines configured to provide a first power supply voltage ELVDD and a second power supply voltage ELVSS may be arranged in the peripheral area PA. In FIG. 4A, the data driver 1200 is illustrated as being directly arranged on the substrate 100 so as to be adjacent to one side of the substrate 100. However, according to some embodiments, the data driver 1200 may be arranged on a flexible printed circuit board (FPCB) electrically connected to pads arranged on one side of the display panel 10. In FIG. 4A, the scan driver 1100 is arranged on the left side, but according to some embodiments, the scan driver may be further arranged on the right side.

A first conductive layer 150 and a second conductive layer 160 may be arranged in the peripheral area PA. The first conductive layer 150 and the second conductive layer 160 may overlap the scan driver 1100.

The first conductive layer 150 may extend to partially surround the display area DA along the edge of the display area DA. The second conductive layer 160 may overlap the first conductive layer 150 and extend to partially surround the display area DA along the edge of the display area DA. The area, in which the first conductive layer 150 and the second conductive layer 160 overlap each other, may include a contact area in which the first conductive layer 150 and the second conductive layer 160 are electrically connected to each other. The first conductive layer 150 and the second conductive layer 160 may each include a plurality of holes as described below.

The first conductive layer 150 and the second conductive layer 160 may overlap a power supply line 170. The power supply line 170 may have a loop that extends to partially surround the display area DA and has one opened side. The power supply line 170 may be connected to the pad PAD of the peripheral area PA and may be configured to receive the second power supply voltage ELVSS from a power supply of the FPCB electrically connected to the pad PAD. The first conductive layer 150 and the second conductive layer 160 may be electrically connected to the power supply line 170 and may be configured to receive the second power supply voltage ELVSS through the power supply line 170.

Some insulating layers in the peripheral area PA may include an opening VH penetrating through the insulating layers. The opening VH may surround the display area DA. The opening VH may form a closed loop that completely surrounds the display area DA. According to some embodiments, the opening VH may overlap the scan driver 1100.

According to some embodiments, as illustrated in FIG. 4A, the first conductive layer 150 and the second conductive layer 160 may extend along the edge of the substrate 100 in a loop shape in which one side of the display area DA, adjacent to the data driver 1200, is opened. For example, the first conductive layer 150 and the second conductive layer 160 may extend along three sides of four sides of the substrate 100 and not exist in one side of four sides of the substrate 100. According to some embodiments, as illustrated in FIG. 4B, the first conductive layer 150 and the second conductive layer 160 may extend along the edge of the substrate 100 in a closed loop shape that completely surrounds the display area DA.

In FIGS. 4A and 4B, the width of the first conductive layer 150 is illustrated as being less than the width of the second conductive layer 160, but embodiments are not limited thereto. According to some embodiments, the width of the first conductive layer 150 may be substantially identical to or greater than the width of the second conductive layer 160.

Figure 5:
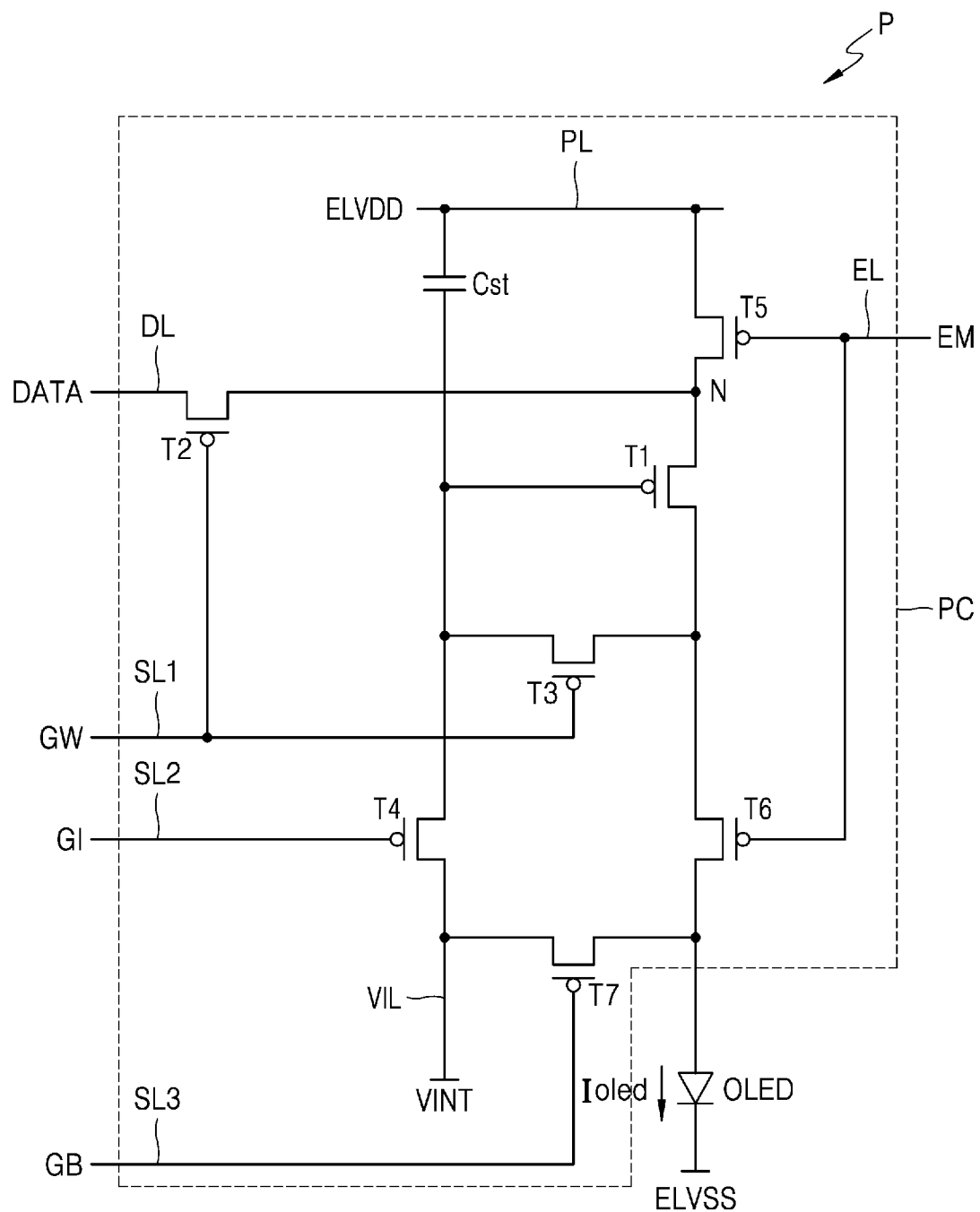
FIG. 5 is an equivalent circuit diagram schematically illustrating a pixel arranged on a display panel, according to some embodiments.

FIG. 5 is an equivalent circuit diagram schematically illustrating a pixel arranged on a display panel, according to some embodiments.

Referring to FIG. 5, signal lines SL1, SL2, SL3, EL, and DL, an initialization voltage line VIL, and a power supply voltage line PL are provided for each pixel P. According to some embodiments, at least one of the signal lines SL1, SL2, SL3, EL, or DL, the initialization voltage line VIL, and/or the power supply voltage line PL may be shared with the adjacent pixels.

The signal lines include a first scan line SL1 configured to transfer a first scan signal GW, a second scan line SL2 configured to transfer a second scan signal GI, a third scan line SL3 configured to transfer a third scan signal GB, an emission control line EL configured to transfer an emission control signal EM, and a data line DL configured to transmit a data signal DATA. The third scan line SL3 may be a second scan line SL2 of a next row, and the third scan signal GB may be a second scan signal GI of the next row.

The power supply voltage line PL is configured to transfer the first power supply voltage ELVDD to the first transistor T1, and the initialization voltage line VIL is configured to transfer, to the pixel P, an initialization voltage VINT for initializing the first transistor T1 and the organic light-emitting diode OLED.

The first scan line SL1, the second scan line SL2, the third scan line SL3, the emission control line EL, and the initialization voltage line VIL may extend in the second direction D2 and may be spaced apart from each other in each row. The data line DL and the power supply voltage line PL may extend in the first direction D1 and may be spaced apart from each other in each column.

The pixel circuit PC of the pixel P may include a plurality of first to seventh transistors T1 to T7 and a capacitor Cst. The first to seventh transistors T1 to T7 may be implemented as thin-film transistors.

The first transistor T1 is electrically connected to the power supply voltage line PL through the fifth transistor T5 and electrically connected to the organic light-emitting diode OLED through the sixth transistor T6. The first transistor T1 serves as a driving transistor and is configured to receive the data signal DATA according to the switching operation of the second transistor T2 and to supply a driving current Ioled to the organic light-emitting diode OLED.

The second transistor T2 is connected to the first scan line SL1 and the data line DL and is turned on according to the first scan signal GW received through the first scan line SL1 to perform a switching operation to transfer, to a node N, the data signal DATA transferred to the data line DL.

The third transistor T3 is connected to the organic light-emitting diode OLED through the sixth transistor T6. The third transistor T3 is turned on according to the first scan signal GW received through the first scan line SL1 to diode-connect the first transistor T1.

The fourth transistor T4 is turned on according to the second scan signal GI received through the second scan line SL2 to transfer the initialization voltage VINT from the initialization voltage line VIL to a gate electrode of the first transistor T1 so as to initialize a gate voltage of the first transistor T1.

The fifth transistor T5 and the sixth transistor T6 are simultaneously turned on according to the emission control signal EM received through the emission control line EL to form a current path so that the driving current Ioled flows from the power supply voltage line PL toward the organic light-emitting diode OLED.

The seventh transistor T7 is turned on according to the third scan signal GB received through the third scan line SL3 to transfer the initialization voltage VINT from the initialization voltage line VIL to the organic light-emitting diode OLED so as to initialize the organic light-emitting diode OLED. The seventh transistor T7 may be omitted.

FIG. 5 illustrates a case in which the fourth transistor T4 is connected to the second scan line SL2, and the seventh transistor T7 is connected to the separate third scan line SL3. According to some embodiments, the seventh transistor T7 may be connected to the second scan line SL2 together with the fourth transistor T4.

The capacitor Cst may be connected to the power supply voltage line PL and the gate electrode of the first transistor T1 to store and maintain a voltage corresponding to a difference between voltages of both ends thereof, so that the voltage applied to the gate electrode of the first transistor T1 is maintained.

The organic light-emitting diode OLED may include a pixel electrode and an opposite electrode, and the counter electrode may be configured to receive the second power supply voltage ELVSS. The organic light-emitting diode OLED is configured to receive the driving current Ioled from the first transistor T1 and emit light to display an image.

Figure 6:
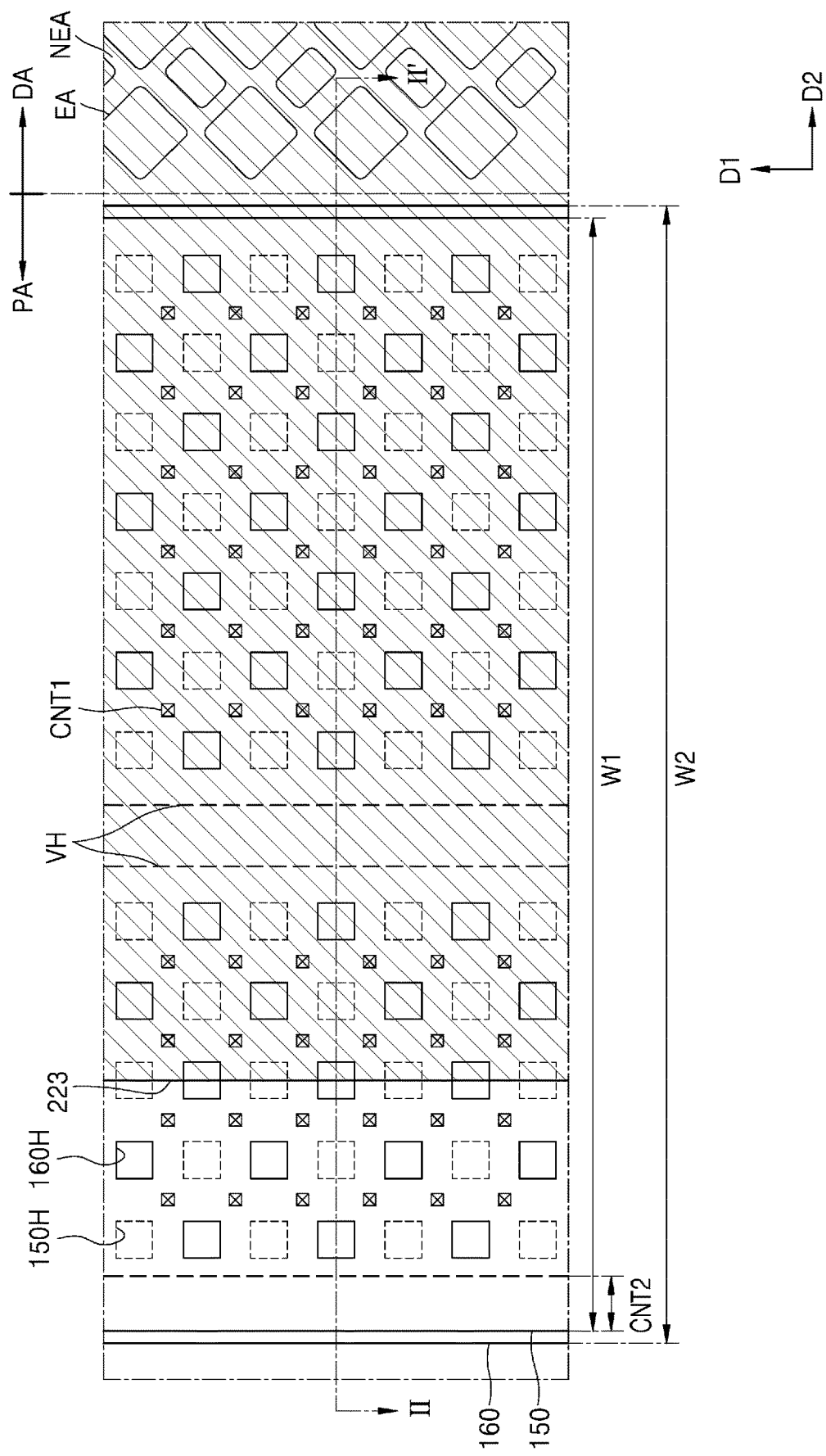
FIG. 6 is a plan view of region I of FIG. 4A.
Figure 7:
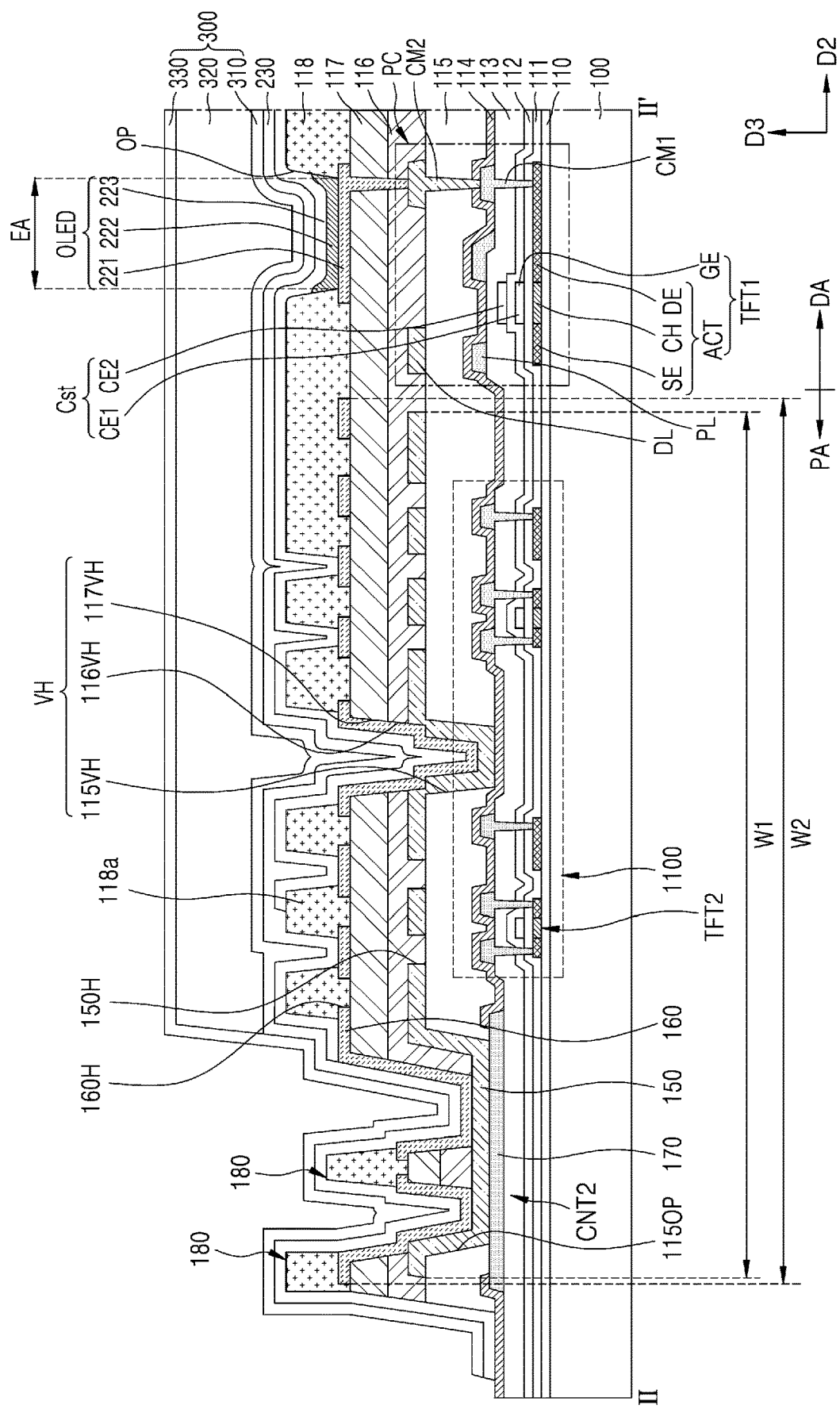
FIG. 7 is a cross-sectional view taken along the line II-II' of FIG. 6.
Figure 8A:
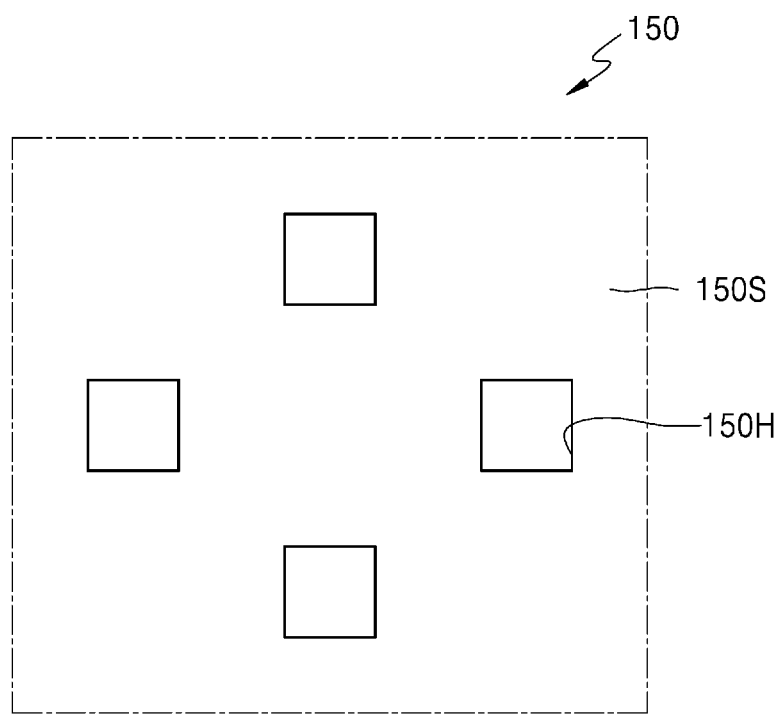
FIGS. 8A to 8C are plan views illustrating a stacking relationship between a first conductive layer and a second conductive layer of FIG. 6.
Figure 8B:
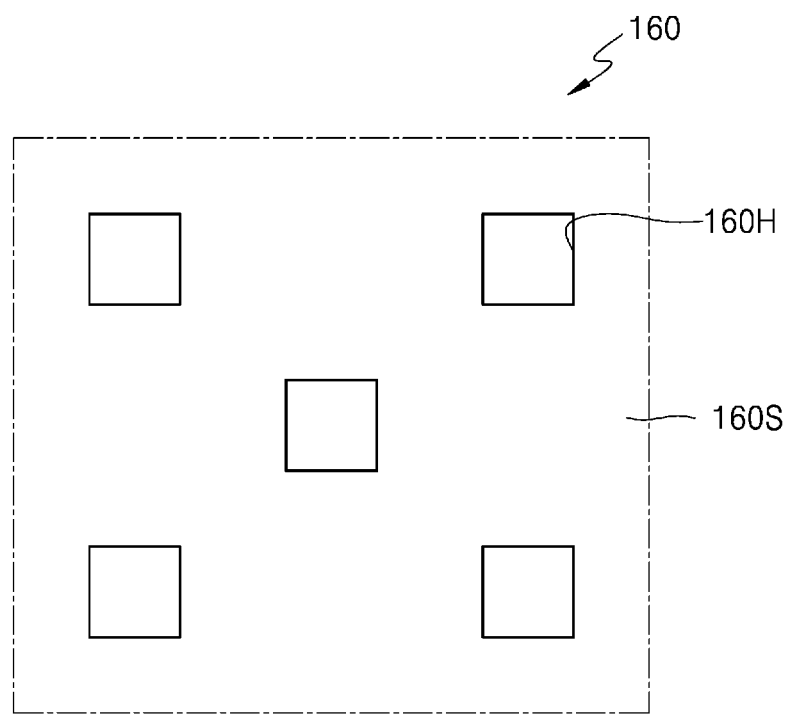
Figure 8C:
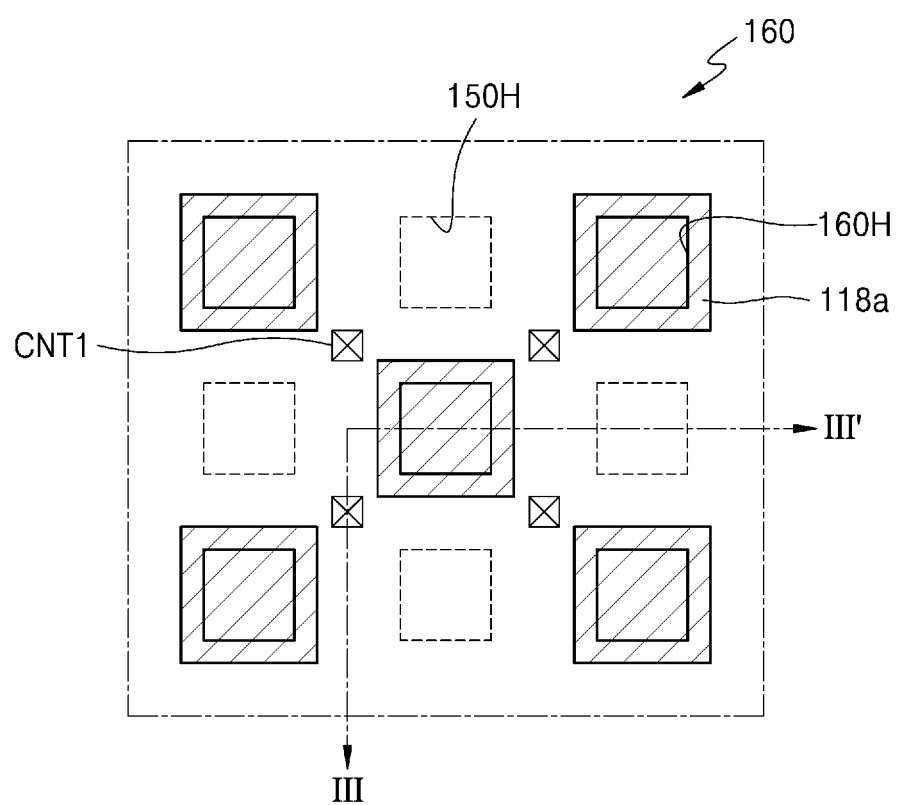
Figure 9A:
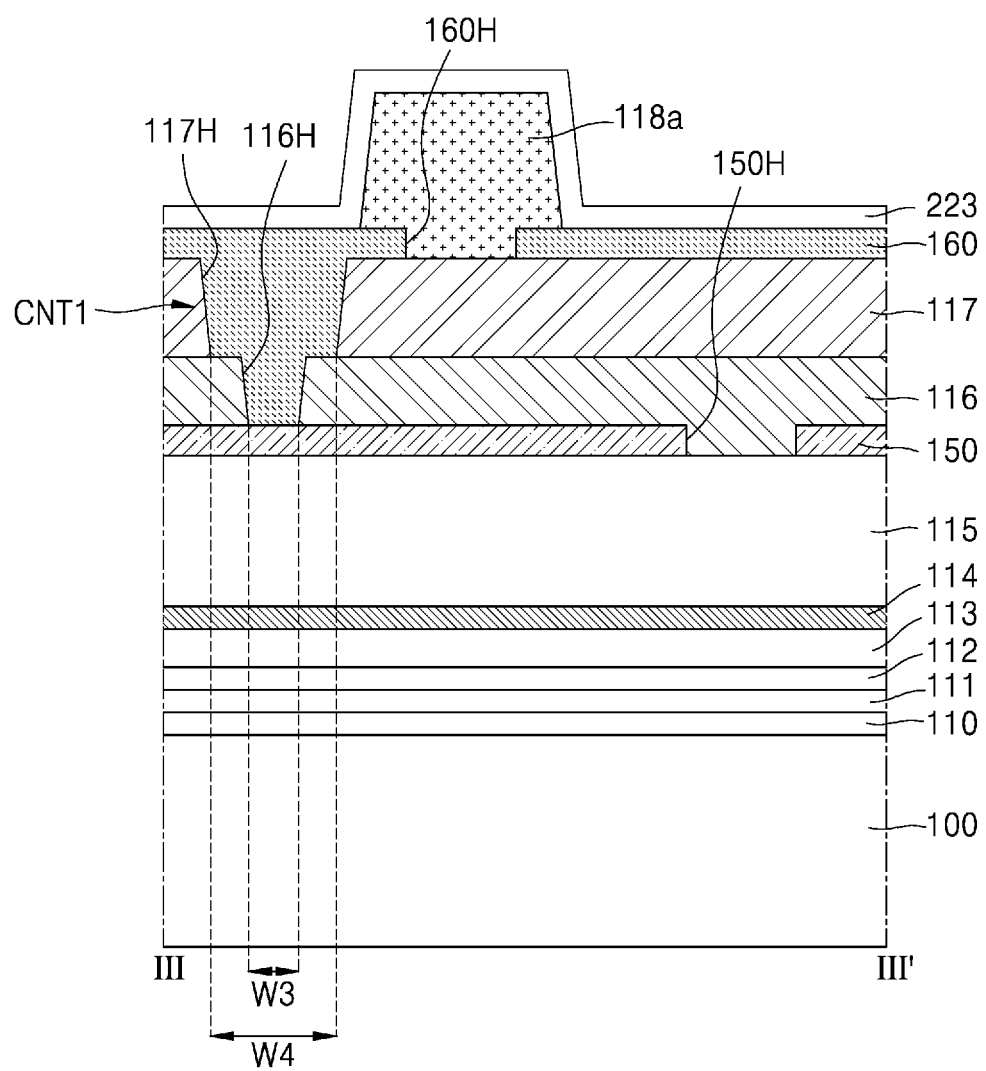
FIGS. 9A and 10A are cross-sectional views taken along the line III-III' of FIG. 8C, respectively.
Figure 9B:
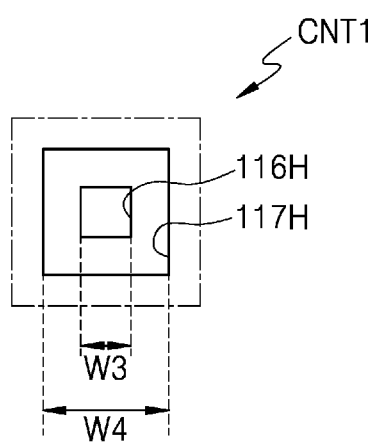
FIGS. 9B and 10B are plan views illustrating first contact areas of FIGS. 9A and 10A, respectively.
Figure 10A:
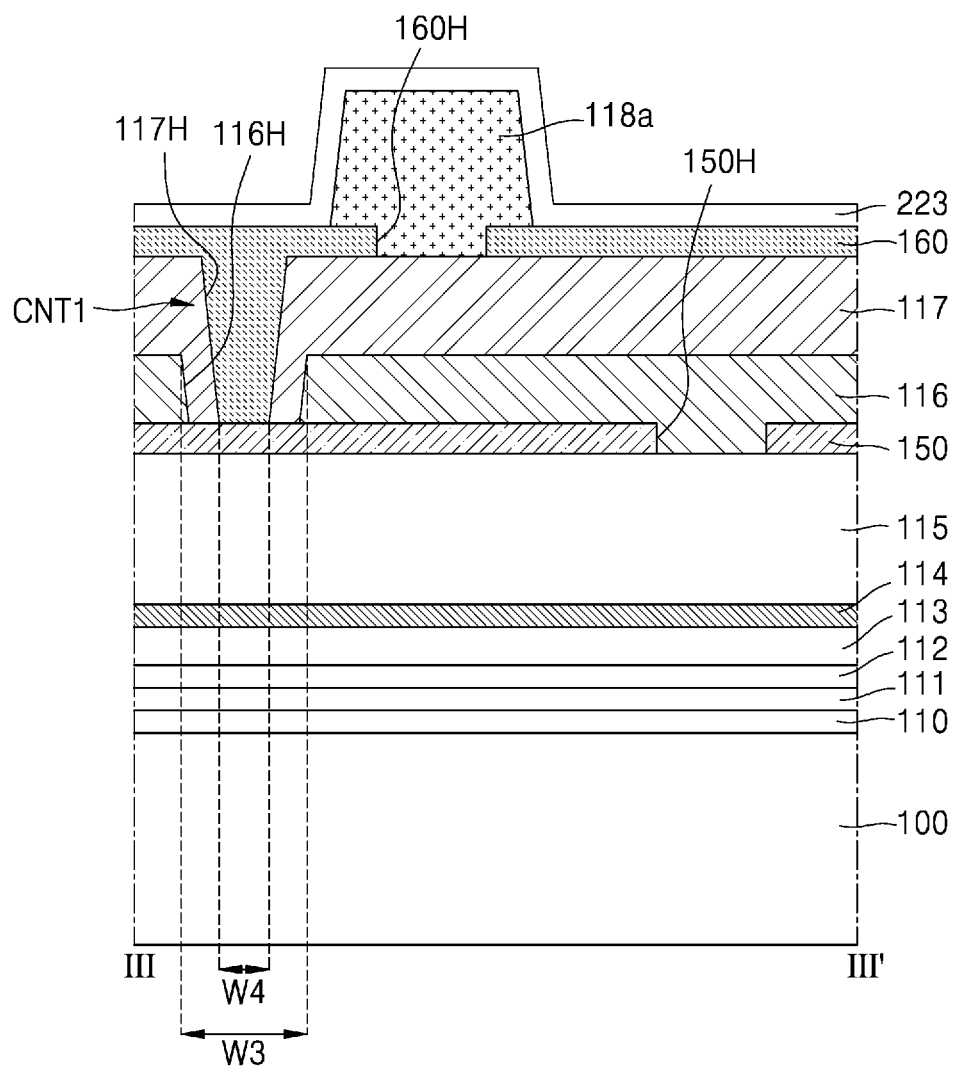
Figure 10B:
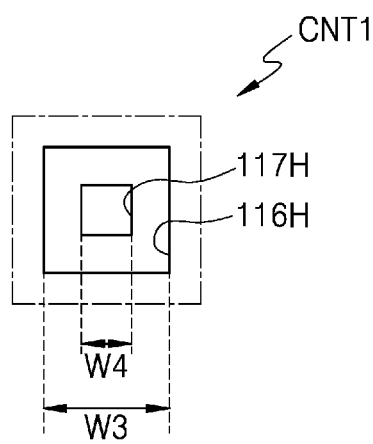

FIG. 6 is a plan view of the region I of FIG. 4A. FIG. 7 is a cross-sectional view taken along line II-II' of FIG. 6. FIGS. 8A to 8C are plan views illustrating a stacking relationship between the first conductive layer 150 and the second conductive layer 160 of FIG. 6. FIGS. 9A and 10A are cross-sectional views taken along the line III-III' of FIG. 8C, respectively, and FIGS. 9B and 10B are plan views illustrating first contact areas of FIGS. 9A and 10A, respectively. Hereinafter, the following description will be provided with reference to FIGS. 6 to 10B. In FIG. 6, the power supply line 170 of FIG. 4A is omitted for convenience of explanation.

Referring to the display area DA of FIG. 7, a first thin-film transistor TFT1, a capacitor Cst, and an organic light-emitting diode OLED electrically connected to the first thin-film transistor TFT1 may be arranged in the display area DA of the substrate 100.

The substrate 100 may include various materials, such as a metal material or a plastic material. According to some embodiments, the substrate 100 may be a flexible substrate. The substrate 100 may include a first base layer, a first barrier layer, a second base layer, and a second barrier layer, which are sequentially stacked. The first base layer and the second base layer may each include a polymer resin. For example, the first base layer and the second base layer may each include a polymer resin, such as polyethersulfone (PES), polyacrylate (PAR), polyetherimide (PEI), polyethylene naphthalate (PEN), polyethylene terephthalate (PET), polyphenylene sulfide (PPS), polyimide (PI), polycarbonate (PC), cellulose triacetate (TAC), or cellulose acetate propionate (CAP). The polymer resin may be transparent. The first barrier layer and the second barrier layer are each a layer configured to prevent penetration of external foreign substances. The first barrier layer and the second barrier layer may each be a single layer or a multi-layer including an inorganic material such as amorphous silicon, silicon nitride, and/or silicon oxide.

A buffer layer 110 may be arranged on the substrate 100. The buffer layer 110 may prevent foreign substances or moisture from penetrating through the substrate 100. The buffer layer 110 may include an inorganic material such as silicon oxide, silicon nitride, and/or silicon oxynitride and may be a single layer or a multi-layer.

The first thin-film transistor TFT1 may be one of the transistors described above with reference to FIG. 5, for example, the first transistor T1 serving as the driving transistor. The first thin-film transistor TFT1 may include a semiconductor layer ACT, a gate electrode GE, a source electrode SE, and a drain electrode DE.

The semiconductor layer ACT may include amorphous silicon, polycrystalline silicon, an oxide semiconductor material, or an organic semiconductor material. The semiconductor layer ACT may include a channel region CH overlapping the gate electrode GE, and a source region SE and a drain region DE arranged on both sides of the channel region CH and including impurities. The impurities may include N-type impurities or P-type impurities. The source region SE and the drain region DE may be a source electrode and a drain electrode of the first thin-film transistor TFT1, respectively.

Considering adhesion to an adjacent layer, surface flatness of a stacked layer, processability, or the like, the gate electrode GE may include a single layer or a multi-layer including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu).

A gate insulating layer 111 between the semiconductor layer ACT and the gate electrode GE may include an inorganic insulating material such as silicon oxide, silicon nitride, silicon oxynitride, aluminum oxide, titanium oxide, tantalum oxide, or hafnium oxide. The gate insulating layer 111 may be a single layer or a multi-layer including the above-described material.

The capacitor Cst includes a lower electrode CE1 and an upper electrode CE2 overlapping each other with a first interlayer insulating layer 112 therebetween. The capacitor Cst may overlap the first thin-film transistor TFT1. In FIG. 7, the gate electrode GE of the first thin-film transistor TFT1 is illustrated as being the lower electrode CE1 of the capacitor Cst. According to some embodiments, the capacitor Cst may not overlap the first thin-film transistor TFT1. The capacitor Cst may be covered with a second interlayer insulating layer 113.

The first interlayer insulating layer 112 and the second interlayer insulating layer 113 may each include an inorganic insulating material such as silicon oxide, silicon nitride, silicon oxynitride, aluminum oxide, titanium oxide, tantalum oxide, or hafnium oxide. The first interlayer insulating layer 112 and the second interlayer insulating layer 113 may each be a single layer or a multi-layer including the above-described material.

A power supply voltage line PL and a first connection electrode CM1 may be arranged on the second interlayer insulating layer 113. The power supply voltage line PL and the first connection electrode CM1 may each be a single layer or a multi-layer including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu). According to some embodiments, the power supply voltage line PL and the first connection electrode CM1 may each be a multi-layer of Ti/Al/Ti.

A protective layer 114 may be arranged on the power supply voltage line PL and the first connection electrode CM1. The protective layer 114 may include an inorganic insulating material such as silicon oxide, silicon nitride, silicon oxynitride, aluminum oxide, titanium oxide, tantalum oxide, or hafnium oxide and may be a single layer or a multi-layer.

A first insulating layer 115 may be arranged on the protective layer 114. A data line DL and a second connection electrode CM2 may be arranged on the first insulating layer 115. The data line DL and the second connection electrode CM2 may each include the same material as that of the power supply voltage line PL. For example, the data line DL and the second connection electrode CM2 may each be a single layer or a multi-layer including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu). According to some embodiments, the data line DL and the second connection electrode CM2 may each be a multi-layer of Ti/Al/Ti. The data line DL and the second connection electrode CM2 may be covered with a second insulating layer 116 and a third insulating layer 117. As illustrated in FIG. 7, at least a part of the data line DL may overlap the power supply voltage line PL. According to some embodiments, the data line DL may not overlap the power supply voltage line PL.

As illustrated in FIG. 7, the data line DL, according to some embodiments, may be arranged above the power supply voltage line PL, but according to some embodiments, the data line DL may be arranged on the second interlayer insulating layer 113, or the power supply voltage line PL may be arranged on the first insulating layer 115, so that the data line DL and the power supply voltage line PL may be arranged on the same layer. According to some embodiments, the power supply voltage line PL may have a double layer structure including a lower power supply voltage line arranged on the second interlayer insulating layer 113 and an upper power supply voltage line arranged on the first insulating layer 115 and electrically connected to the lower power supply voltage line.

The first insulating layer 115, the second insulating layer 116, and the third insulating layer 117 may each be an organic insulating layer serving as a planarization insulating layer. For example, the first insulating layer 115, the second insulating layer 116, and the third insulating layer 117 may each include an organic insulating material, for example, a general-purpose polymer such as polymethylmethacrylate (PMMA) or polystyrene (PS), a polymer derivative having a phenol-based group, an acryl-based polymer, an imide-based polymer, a siloxane-based polymer, an aryl ether polymer, an amide-based polymer, a fluorine-based polymer, a p-xylene-based polymer, a vinyl alcohol-based polymer, and any blend thereof. According to some embodiments, the first insulating layer 115 and the third insulating layer 117 may each be an organic insulating layer including polyimide, and the second insulating layer 116 may be an organic insulating layer including siloxane.

When the organic light-emitting diode OLED has flexure due to the step differences of the conductive layers arranged below the organic light-emitting diode OLED, the reflective color bands due to reflection of light emitted by the organic light-emitting diode OLED may be recognized. According to some embodiments, a multi-layered organic insulating layer including at least two layers between the organic light-emitting diode OLED and the thin-film transistor may be provided in order to planarize the layers arranged below the organic light-emitting diode OLED, thereby reducing the above-described problem.

Because a part of the organic insulating layer is removed in the peripheral area PA by a process such as ashing or etching, a thickness of the organic insulating layer may be reduced and a distance between the conductive layer on the organic insulating layer and the conductive layer below the organic insulating layer may be reduced. This may cause quality deterioration due to coupling between the conductive layers or process/driving progressive burning. The multi-layered organic insulating layer according to some embodiments reduce or mitigate deterioration due to coupling between the conductive layers in the peripheral area PA or process/driving progressive burning.

As illustrated in FIG. 3, the foldable display apparatus according to some embodiments includes a thin plastic window 60 and does not include a polarization layer between the display panel 10 and the window 60. Therefore, in the foldable display apparatus according to some embodiments, because the planarization of the layers arranged below the organic light-emitting diode OLED is improved by the multi-layered organic insulating layer, external light reflection may be minimized without a separate polarization layer.

In FIG. 7, two organic insulating layers, that is, the second insulating layer 116 and the third insulating layer 117, are arranged between the first conductive layer 150 and the second conductive layer 160, but according to some embodiments, three or more organic insulating layers may be arranged between the first conductive layer 150 and the second conductive layer 160.

A display element, for example, an organic light-emitting diode OLED, may be arranged in the display area DA above the third insulating layer 117. The organic light-emitting diode OLED may include a first electrode 221 serving as a pixel electrode, an intermediate layer 222, and a second electrode 223 serving as an opposite electrode.

The first electrode 221 of the organic light-emitting diode OLED may be arranged on the third insulating layer 117 and may be connected to the first thin-film transistor TFT1 through the first connection electrode CM1 on the second interlayer insulating layer 113 and the second connection electrode CM2 on the first insulating layer 115.

The first electrode 221 may include conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). According to some embodiments, the first electrode 221 may include a reflective film including silver (Ag), magnesium (Mg), aluminum (Al), platinum (Pt), palladium (Pd), gold (Au), nickel (Ni), neodymium (Nd), iridium (Ir), chromium (Cr), or any compound thereof. According to some embodiments, the first electrode 221 may further include a film including ITO, IZO, ZnO, or $In_2O_3$ above and/or below the reflective film.

A fourth insulating layer 118 may be arranged on the third insulating layer 117. The fourth insulating layer 118 may include an opening corresponding to each pixel in the display area DA, that is, an opening OP exposing a part of the first electrode 221. The opening OP of the fourth insulating layer 118 may define the emission area EA of the pixel (see FIG. 6). That is, the fourth insulating layer 118 may be arranged corresponding to the remaining area other than the emission area EA, that is, the non-emission area. A size of the emission area EA may be changed according to the color of light emitted from the pixel.

In addition, because the fourth insulating layer 118 increases a distance between the edge of the first electrode 221 and the second electrode 223 above the first electrode 221, the fourth insulating layer 118 may prevent or reduce instances of arcs or the like occurring at the edge of the first electrode 221. The fourth insulating layer 118 may include, for example, an organic material such as polyimide (PI) or hexamethyldisiloxane (HMDSO).

The intermediate layer 222 includes an emission layer. The emission layer may include a high-molecular-weight or low-molecular-weight organic material that emits light of a certain color. According to some embodiments, the intermediate layer 222 may include a first functional layer arranged below the emission layer and/or a second functional layer arranged above the emission layer. The first functional layer and/or the second functional layer may include an integrated layer over the first electrodes 221, or may include layers respectively patterned corresponding to the first electrodes 221.

The first functional layer may be a single layer or a multi-layer. For example, when the first functional layer includes a high-molecular-weight material, the first functional layer is a hole transport layer (HTL) having a single-layered structure and may include poly-(3,4)-ethylene-dihydroxy thiophene (PEDOT) or polyaniline (PANI). When the first functional layer includes a low-molecular-weight material, the first functional layer may include a hole injection layer (HIL) and an HTL.

The second functional layer may be omitted. For example, when the first functional layer and the emission layer each include a high-molecular-weight material, the second functional layer may be formed so as to improve characteristics of the organic light-emitting diode. The second functional layer may be a single layer or a multi-layer. The second functional layer may include an electron transport layer (ETL) and/or an electron injection layer (EIL).

The second electrode 223 is arranged to face the first electrode 221 with the intermediate layer 222 therebetween. The second electrode 223 may include a conductive material having a relatively low work function. For example, the second electrode 223 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the second electrode 223 may further include a layer such as ITO, IZO, ZnO, or $In_2O_3$ on the (semi)transparent layer including the above-mentioned material.

The second electrode 223 may be integrally formed in a plurality of organic light-emitting diodes OLED in the display area DA to face a plurality of first electrodes 221 and may be arranged above the intermediate layer 222 and the fourth insulating layer 118.

Next, referring to the peripheral area PA of FIG. 7, a scan driver 1100 may be arranged in the peripheral area PA of the substrate 100. The scan driver 1100 may include second thin-film transistors TFT2 and may include wirings (not illustrated) connected to the second thin-film transistors TFT2. The second thin-film transistor TFT2 may be formed by the same process as that of the first thin-film transistor TFT1 of the pixel circuit PC. Therefore, a detailed description of the second thin-film transistor TFT2 will be omitted. Although not illustrated, a control signal line configured to apply a control signal to the scan driver 1100 including the second thin-film transistor TFT2 may be further arranged in the peripheral area PA. The control signal line may include signal lines configured to apply a clock signal, an inverted clock signal, a carry signal, and the like. The control signal line may be arranged on the same layer as the semiconductor layer ACT, the gate electrode GE, the upper electrode CE2 of the capacitor Cst, or the power supply voltage line PL. The scan driver 1100 may be covered with the protective layer 114 as illustrated in FIG. 7. According to some embodiments, the protective layer 114 may not be arranged in the peripheral area PA.

The buffer layer 110, the gate insulating layer 111, the first interlayer insulating layer 112, and the second interlayer insulating layer 113, which are arranged in the display area DA, may extend to the peripheral area PA.

The power supply line 170 may be arranged on the second interlayer insulating layer 113 outside the scan driver 1100.

The power supply line 170 may be a line arranged in the peripheral area PA so as to provide the second power supply voltage ELVSS to each pixel P. The power supply line 170 may include the same material as that of the data line DL and/or the driving voltage line PL and may be arranged on the same layer as that of the data line DL and/or the driving voltage line PL.

The first insulating layer 115, the second insulating layer 116, and the third insulating layer 117, which are arranged in the display area DA, may extend to the peripheral area PA and have an opening VH in the peripheral area PA. The opening VH may include an opening 115VH of the first insulating layer 115, an opening 116VH of the second insulating layer 116, and an opening 117VH of the third insulating layer 117. The openings 115VH, 116VH, and 117VH may overlap each other. The inner surfaces of the openings 115VH, 116VH, and 117VH may not coincide with each other, and sizes of the openings 115VH, 116VH, and 117VH may be different from each other. According to some embodiments, the inner surfaces of the openings 115VH, 116VH, and 117VH may coincide with each other.

The first insulating layer 115, the second insulating layer 116, and the third insulating layer 117 may be physically divided into at least two portions with respect to the opening VH in the peripheral area PA. Therefore, instances of impurities or contaminants penetrating from the outside, gases or moisture generated in the first insulating layer 115, the second insulating layer 116, and the third insulating layer 117, which are arranged outside the opening VH, and the like may be prevented from reaching the inside of the display area DA through the inside of the first insulating layer 115, the second insulating layer 116, and the third insulating layer 117.

The first conductive layer 150 and the second conductive layer 160 may overlap the scan driver 1100. A first width W1 of the first conductive layer 150 and a second width W2 of the second conductive layer 160 may be greater than or equal to a width of the scan driver 1100. In FIGS. 6 and 7, the second width W2 is illustrated as being greater than the first width W1, but the second width W2 may be less than or equal to the first width W1.

The first conductive layer 150 may be arranged on a layer between the first insulating layer 115 and the second insulating layer 116. The first conductive layer 150 may be arranged on the same layer as the data line DL and the second connection electrode CM2. The first conductive layer 150 may include the same material as that of the data line DL and may completely cover the opening 115VH of the first insulating layer 115. The second conductive layer 160 may be arranged on the third insulating layer 117. The second conductive layer 160 may be arranged on the same layer as that of the first electrode 221 of the organic light-emitting diode OLED. The second conductive layer 160 may include the same material as that of the first electrode 221 and may completely cover the opening 116VH of the second insulating layer 116 and the opening 117VH of the third insulating layer 117.

At least one of the first conductive layer 150 or the second conductive layer 160 may include a hole. The first conductive layer 150 may include a plurality of first holes 150H arranged around the opening VH. As illustrated in FIGS. 6 and 8A, the first holes 150H may be apart from each other when seen in a plan view. The second conductive layer 160 may include a plurality of second holes 160H arranged around the opening VH. As illustrated in FIGS. 6 and 8B, the second holes 160H may be apart from each other when seen in a plan view.

The first holes 150H of the first conductive layer 150 and the second holes 160H of the second conductive layer 160 may function as an outgassing passage configured to discharge gases generated from the first insulating layer 115, the second insulating layer 116, and the third insulating layer 117 to the outside. Therefore, it is possible to prevent or reduce a problem in which gases generated from the first insulating layer 115, the second insulating layer 116, and the third insulating layer 117 penetrate into the display area DA to deteriorate quality of an image implemented on the display apparatus.

The first hole 150H and the second hole 160H may be offset from each other. That is, the first holes 150H of the first conductive layer 150 and the second holes 160H of the second conductive layer 160 do not overlap each other in the third direction D3, and may be offset in the first direction D1 and the second direction D2 so as to be alternately arranged. As illustrated in FIGS. 7 and 8C, the center of the first hole 150H and the center of the second hole 160H may be offset without coinciding with each other. The first hole 150H of the first conductive layer 150 overlaps a portion 160S of the second conductive layer 160, and the second hole 160H of the second conductive layer 160 overlaps a portion 150S of the first conductive layer 150. The portion of the conductive layer represents an area in which the hole of the conductive layer is not formed. Therefore, the portion 150S of the first conductive layer 150 may be the remaining area of the first conductive layer 150 except for the first hole 150H, and the portion 160S of the second conductive layer 160 may be the remaining area of the second conductive layer 160 except for the second hole 160H.

As illustrated in FIGS. 7 and 8C, the second holes 160H of the second conductive layer 160 may be covered with the fourth insulating layer 118 extending from the display area DA to the peripheral area PA. The fourth insulating layer 118 may include island-shaped insulating patterns 118a arranged corresponding to the second holes 160H of the second conductive layer 160. The insulating patterns 118a may be formed by patterning the fourth insulating layer 118 in the peripheral area PA.

In FIGS. 7 and 8C, the first holes 150H and the second holes 160H are illustrated as squares, but according to some embodiments, the first holes 150H and the second holes 160H may have various shapes, such as a polygon such as a rectangle or a triangle, a circle, or an ellipse. The size of the first hole 150H may be identical to or different from the size of the second hole 160H.

The first conductive layer 150 and the second conductive layer 160 may be in contact with each other in at least one first contact area CNT1 and may be electrically connected to each other. The first contact area CNT1 may be arranged between the first holes 150H of the first conductive layer 150 and the second holes 160H of the second conductive layer 160. The first contact area CNT1 may be an area in which the portion 150S of the first conductive layer 150 and the portion 160S of the second conductive layer 160 overlap each other. In the first contact area CNT1, the second insulating layer 116 may include a hole 116H penetrating through the second insulating layer 116, and the third insulating layer 117 may include a hole 117H penetrating through the third insulating layer 117. The hole 116H of the second insulating layer 116 and the hole 117H of the third insulating layer 117 may overlap each other. According to some embodiments, as illustrated in FIGS. 9A and 9B, a width (size) W4 of the hole 117H of the third insulating layer 117 may be greater than a width W3 of the hole 116H of the second insulating layer 116. According to some embodiments, as illustrated in FIGS. 10A and 10B, the width W4 of the hole 117H of the third insulating layer 117 may be less than the width W3 of the hole 116H of the second insulating layer 116. In this case, the third insulating layer 117 may cover the inner surface of the hole 116H of the second insulating layer 116. The holes 116H of the second insulating layer 116 and the holes 117H of the third insulating layer 117 may not overlap the first holes 150H of the first conductive layer 150 and the second holes 160H of the second conductive layer 160 and may be offset. The second conductive layer 160 may be in contact with the first conductive layer 150 through the hole 116H of the second insulating layer 116 and the hole 117H of the third insulating layer 117.

As illustrated in FIGS. 6 and 7, an end portion of the first conductive layer 150 and an end portion of the second conductive layer 160 may overlap the power supply line 170 in the second contact area CNT2 around the edge of the substrate 100, and be in contact with the power supply line 170. In the second contact area CNT2, the power supply line 170 may be exposed by an opening 115OP of the first insulating layer 115, and the first conductive layer 150 may be in contact with the power supply line 170 at the opening 115OP of the first insulating layer 115. In the second contact area CNT2, the end portion of the first conductive layer 150 may be in direct contact with the power supply line 170, and the end portion of the second conductive layer 160 may be in direct contact with the end portion of the first conductive layer 150.

The exposed portion of the second conductive layer 160, that is, the portion of the second conductive layer 160 not covered with the fourth insulating layer 118, may be in direct contact with the second electrode 223 extending from the display area DA to the peripheral area PA. The second conductive layer 160 may be in direct contact with the second electrode 223 at the opening VH. The second conductive layer 160 may contact with the second electrode 223 and thus the second power supply voltage ELVSS supplied from the power supply line 170 may be supplied to the second electrode 223. Therefore, the drop of the second power supply voltage ELVSS may be reduced. FIG. 7 illustrates a case in which the end portion of the second electrode 223 extends toward the outer edge of the substrate 100 so as to cover at least a part of the scan driver 1100.

An encapsulation layer 300 may be arranged on the second electrode 223 so that the display panel 10 is protected from foreign substances, moisture, or the like. The encapsulation layer 300 may include at least one organic encapsulation layer and at least one inorganic encapsulation layer. FIG. 7 illustrates a case in which the encapsulation layer 300 includes a first inorganic encapsulation layer 310, a second inorganic encapsulation layer 330, and an organic encapsulation layer 320 therebetween. According to some embodiments, the number of organic encapsulation layers, the number of inorganic encapsulation layers, and the stacking order may be changed.

When necessary, a plurality of layers including a capping layer 230 may be arranged between the first inorganic encapsulation layer 310 and the opposite electrode 223. The capping layer 230 is illustrated in FIG. 7, but according to some embodiments, the capping layer 230 may be omitted.

The first and second inorganic encapsulation layers 310 and 330 may each include one or more inorganic insulating materials such as aluminum oxide, titanium oxide, tantalum oxide, hafnium oxide, zinc oxide, silicon oxide, silicon nitride, and silicon oxynitride. The organic encapsulation layer 320 may include polyethylene terephthalate, polyethylene naphthalate, polycarbonate, polyimide, polyethylene-sulfonate, polyoxymethylene, polyarylate, hexamethyldisiloxane, acrylic resin (for example, polymethylmethacrylate, polyacrylic acid, or the like), or any combination thereof. Because the first inorganic encapsulation layer 310 is formed along the underlying structure thereof, the upper surface of the first inorganic encapsulation layer 310 may not be flat. The organic encapsulation layer 320 may cover the first inorganic encapsulation layer 310 and have a sufficient thickness. The upper surface of the organic encapsulation layer 320 may be substantially flat. The second inorganic encapsulation layer 330 may extend outward from the organic encapsulation layer 320 so as to be in contact with the first inorganic encapsulation layer 310, thereby preventing or reducing exposure of the organic encapsulation layer 320 to the outside.

Meanwhile, when forming the organic encapsulation layer 320, it is necessary to make limitation so that a material for forming the organic encapsulation layer 320 is located within a preset area. To this end, as illustrated in FIG. 7, at least one dam 180 may be formed in the peripheral area PA. The dam 180 may have a multi-layered structure. The dam 180 may include at least one of a layer that is simultaneously formed of the same material as those of the first insulating layer 115, the second insulating layer 116, the third insulating layer 117, or the fourth insulating layer 118 when forming the first insulating layer 115, the second insulating layer 116, the third insulating layer 117, or the fourth insulating layer 118. According to some embodiments, the dam 180 may include at least one of an organic layer or an inorganic layer formed by a separate process.

At least a part of the dam 180 may be arranged on the end portion of the first conductive layer 150 on the power supply line 170. The first inorganic encapsulation layer 310 and the second inorganic encapsulation layer 330 may be formed up to the outside of the dam 180. The position of the organic encapsulation layer 320 may be limited by the dam 180, thereby preventing or reducing instances of the material for forming the organic encapsulation layer 320 overflowing outside the dam 180.

Figure 11:
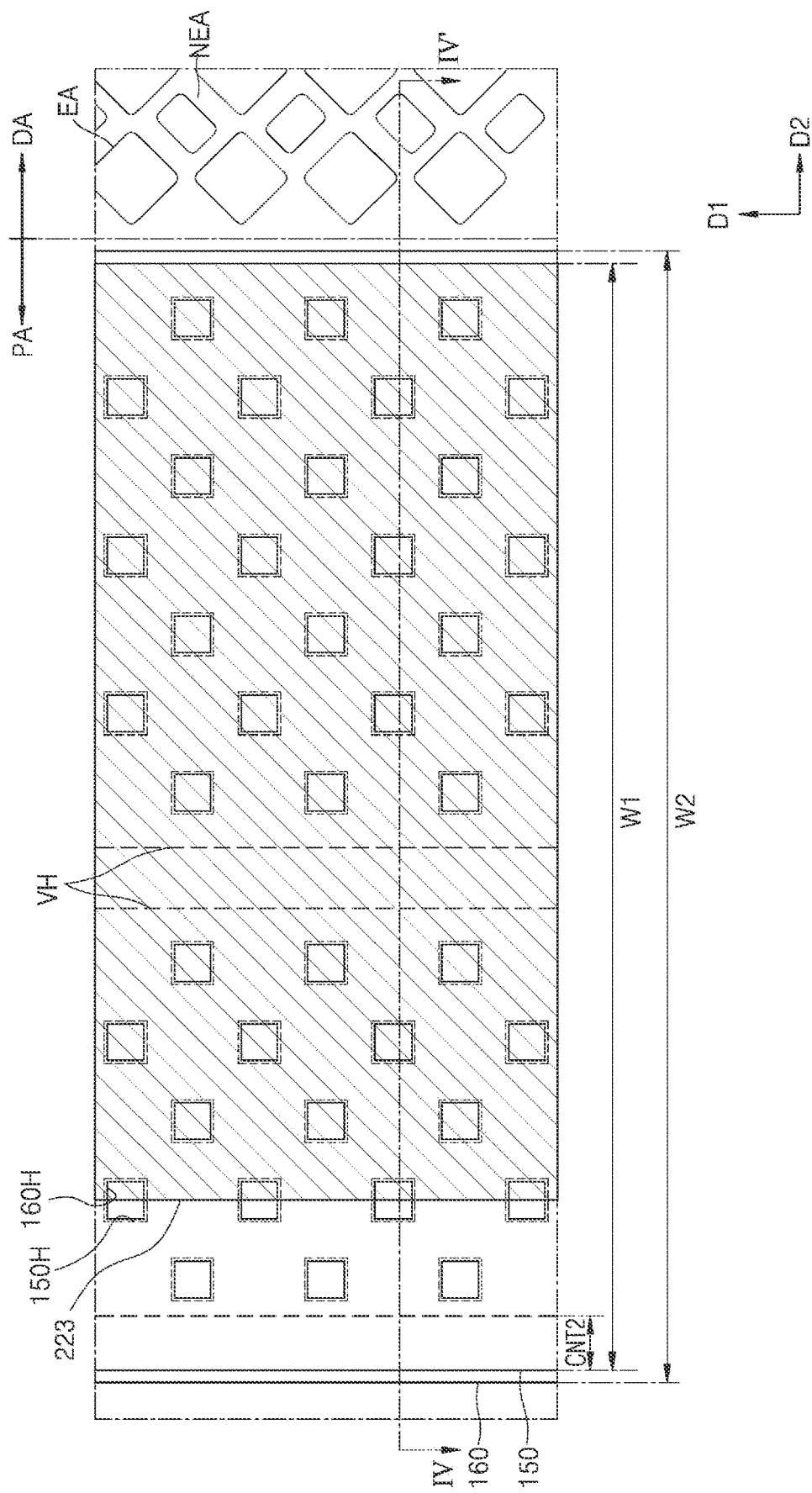
FIG. 11 is a plan view of region I of FIG. 4A, according to some embodiments.
Figure 12:
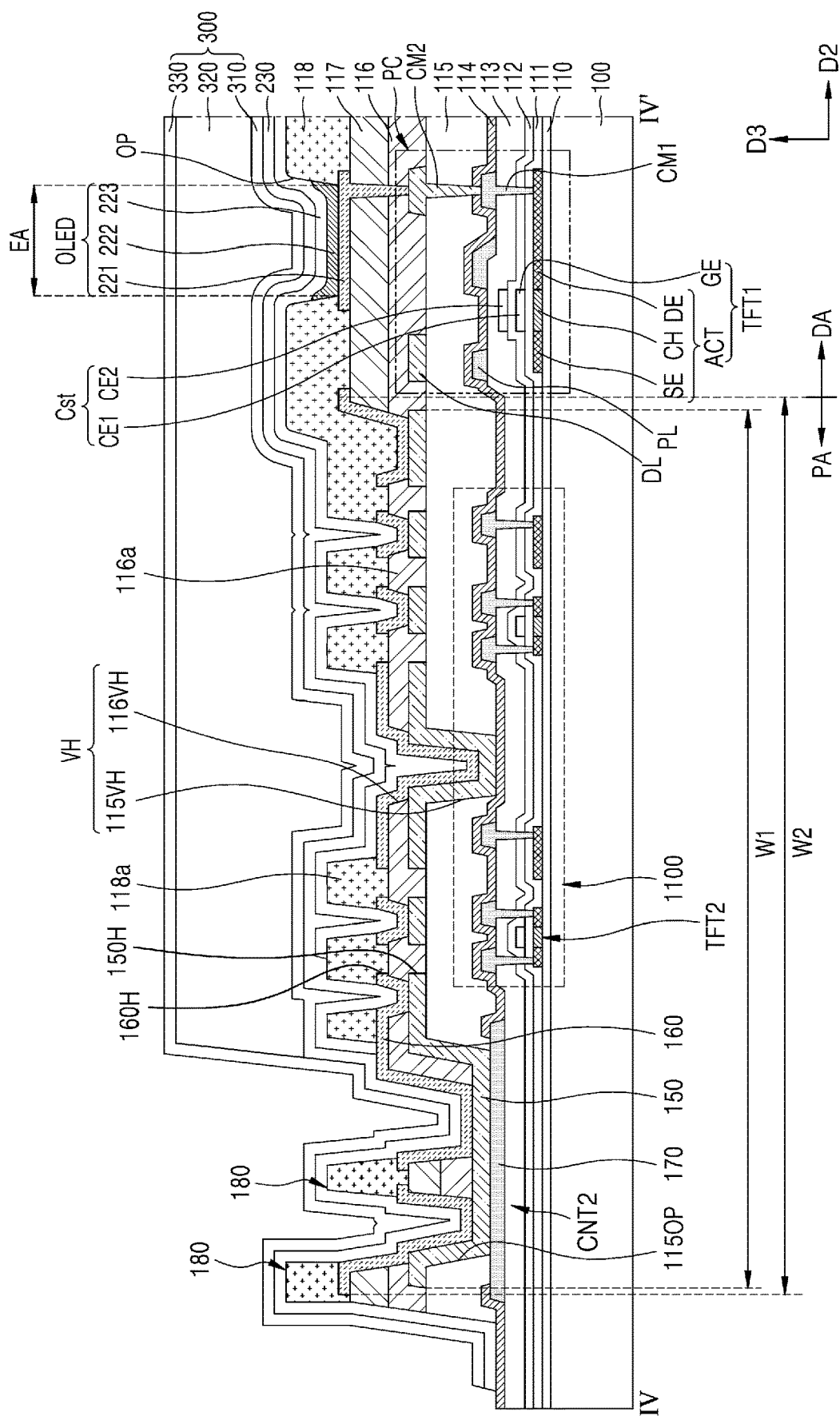
FIG. 12 is a cross-sectional view taken along the line IV-IV' of FIG. 11.
Figure 13A:
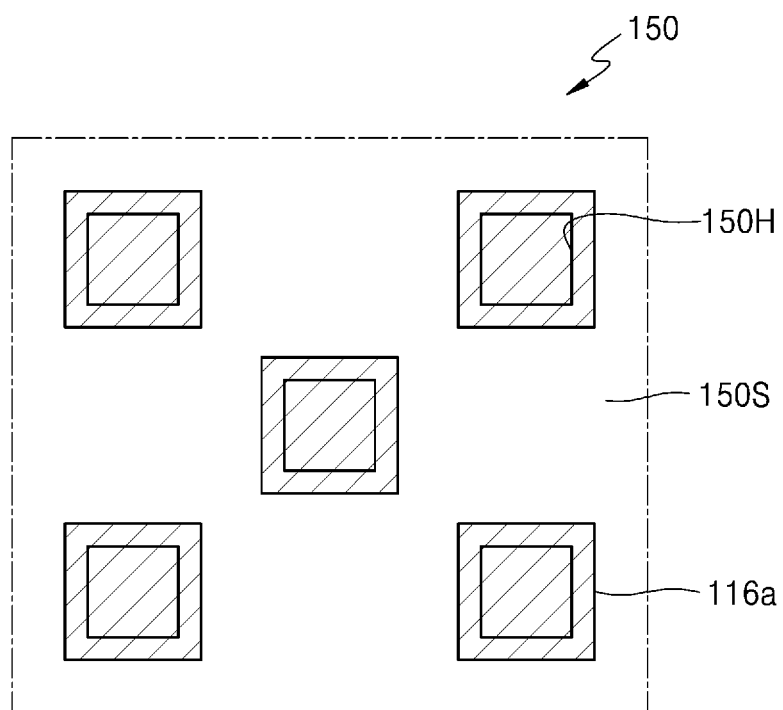
FIGS. 13A and 13B are plan views illustrating a stacking relationship between a first conductive layer and a second conductive layer of FIG. 11.
Figure 13B:
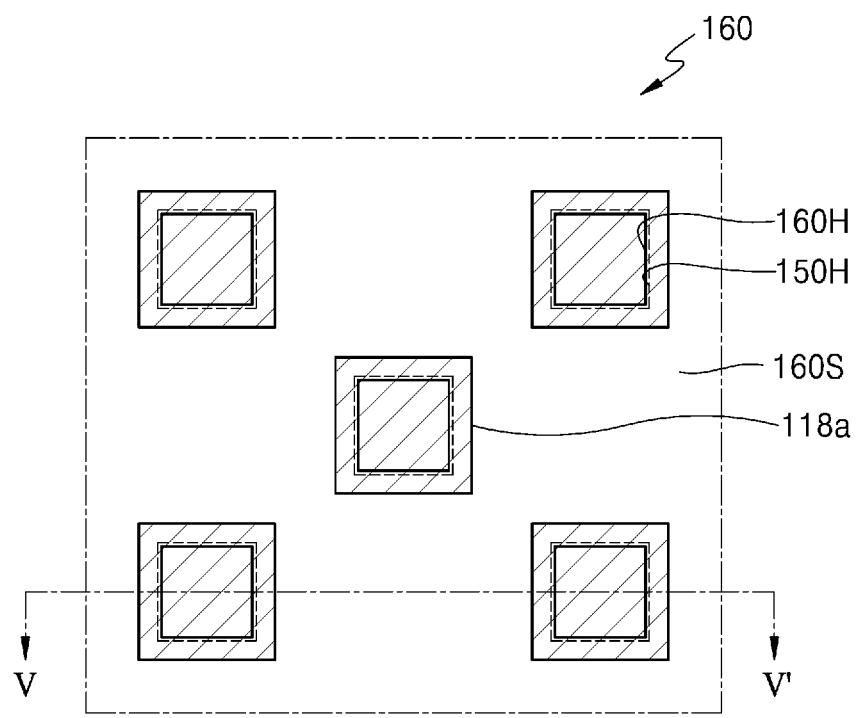
Figure 14:
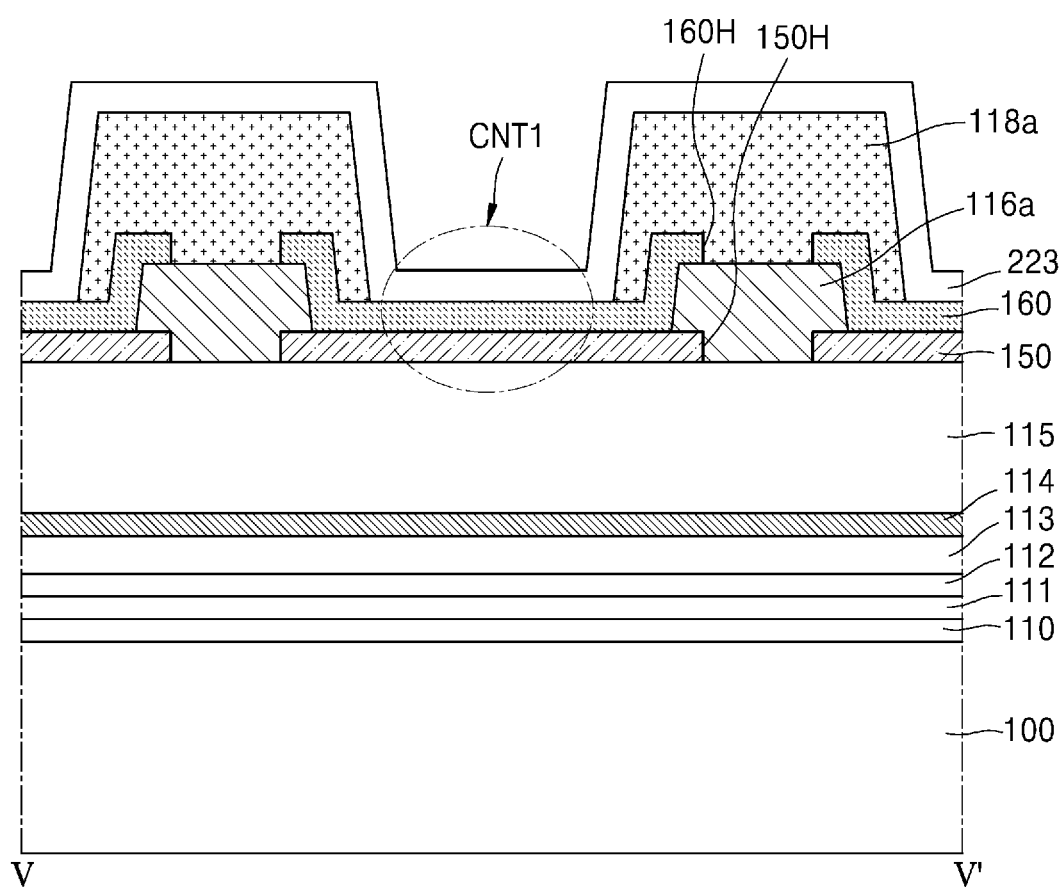
FIG. 14 is a cross-sectional view taken along the line V-V' of FIG. 13B.

FIG. 11 is a plan view of the region I of FIG. 4A, according to some embodiments. FIG. 12 is a cross-sectional view taken along line IV-IV' of FIG. 11. FIGS. 13A and 13B are plan views illustrating a stacking relationship between the first conductive layer 150 and the second conductive layer 160 of FIG. 11. FIG. 14 is a cross-sectional view taken along line V-V' of FIG. 13B. Hereinafter, the following description will be given with reference to FIGS. 11 to 14, but a description of the same configurations as those of FIGS. 6 to 10B will be omitted. In FIG. 11, the power supply line 170 of FIG. 4A is omitted for convenience of explanation.

A first insulating layer 115 arranged in a display area DA may extend to a peripheral area PA and have an opening 115VH in the peripheral area PA. A first conductive layer 150 may be arranged on the first insulating layer 115. The first conductive layer 150 may completely cover the opening 115VH of the first insulating layer 115. The first conductive layer 150 may include a plurality of first holes 150H. As illustrated in FIGS. 11 and 13A, the first holes 150H may be apart from each other when seen in a plan view. The first holes 150H of the first conductive layer 150 may be covered with a second insulating layer 116 extending from the display area DA to the peripheral area PA.

The second insulating layer 116 may extend from the display area DA to the peripheral area PA and have an opening 116VH overlapping the opening 115VH of the first insulating layer 115 in the peripheral area PA. The second insulating layer 116 may include island-shaped insulating patterns 116a corresponding to the first holes 150H of the first conductive layer 150. The insulating patterns 116a may be formed by patterning the second insulating layer 116 in the peripheral area PA. A part of the portion 150S of the first conductive layer 150, which is not covered with the insulating patterns 116a, may be exposed.

A second conductive layer 160 may be arranged on the exposed portion of the first conductive layer 150 and the second insulating layer 116 including the insulating patterns 116a. The second conductive layer 160 may completely cover the opening 116VH of the second insulating layer 116. The second conductive layer 160 may include a plurality of second holes 160H. As illustrated in FIGS. 11 and 13B, the second holes 160H may be apart from each other when seen in a plan view. The second holes 160H may be arranged to overlap the first holes 150H when seen in a cross-sectional view and a plan view. That is, the center of the first hole 150H and the center of the second hole 160H may coincide with each other. The second hole 160H may be arranged above the insulating pattern 116a to expose the upper surface of the insulating pattern 116a. In FIG. 13B, the size of the first hole 150H is illustrated as being greater than the size of the second hole 160H, but this is merely an example. According to some embodiments, the size of the first hole 150H may be identical to or less than the size of the second hole 160H.

The second conductive layer 160 may be in direct contact with the exposed part of the portion 150S of the first conductive layer 150, in which the insulating patterns 116a are not arranged. That is, the first contact area CNT1 of the first conductive layer 150 and the second conductive layer 160 may be an area in which the exposed part of the first conductive layer 150 overlaps the portion 160S of the second conductive layer 160. The direct contact between the first conductive layer 150 and the second conductive layer 160 may increase the contact area of the first conductive layer 150 and the second conductive layer 160 and further reduce the drop of the second power supply voltage ELVSS.

The second holes 160H of the second conductive layer 160 may be covered with a fourth insulating layer 118 extending from the display area DA to the peripheral area PA. The fourth insulating layer 118 may include insulating patterns 118a corresponding to the second holes 160H of the second conductive layer 160. The fourth insulating layer 118 may not be arranged in the opening VH. The insulating pattern 118a of the fourth insulating layer 118 may overlap the insulating pattern 116a of the second insulating layer 116.

The third insulating layer 117 arranged in the display area DA may not extend to the peripheral area PA. For example, the third insulating layer 117 may be formed on the second insulating layer 116, but the third insulating layer 117 may be removed in the peripheral area PA. In this case, a part of the third insulating layer 117 may remain in the peripheral area PA so as to form the dam 180.

Because the peripheral area PA requires a relatively low level of planarization compared to the display area DA, the third insulating layer 117 is omitted in the peripheral area PA, and the second holes 160H of the second conductive layer 160 and the first holes 150H of the first conductive layer 150 overlap each other. It is possible to reduce the thickness of the peripheral area PA, to reduce the thickness of the gas generating layer, and to shorten the path of the outgassing passage.

The exposed part of the second conductive layer 160, that is, the part of the second conductive layer 160 not covered with the fourth insulating layer 118, may be in direct contact with the second electrode 223 extending from the display area DA to the peripheral area PA.

Figure 15:
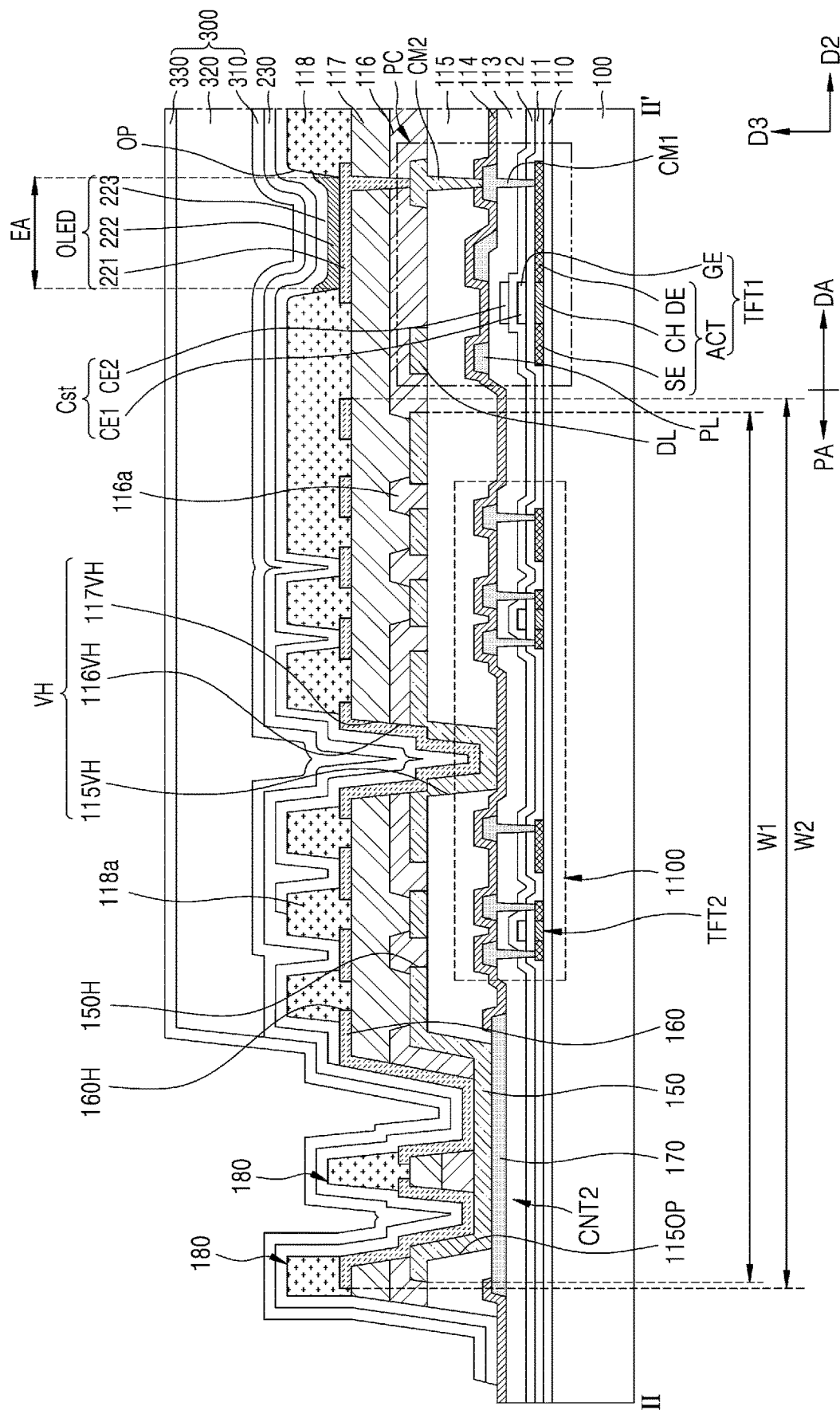
FIG. 15 is a cross-sectional view of the region I of FIG. 4A taken along a second direction, according to some embodiments.
Figure 16A:
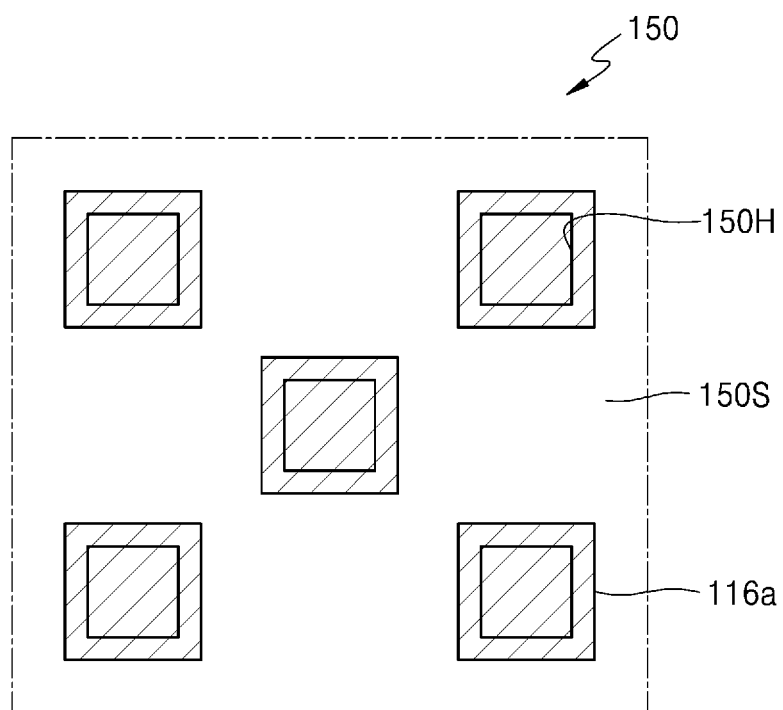
FIGS. 16A and 16B are plan views illustrating a stacking relationship between a first conductive layer and a second conductive layer of FIG. 15.
Figure 16B:
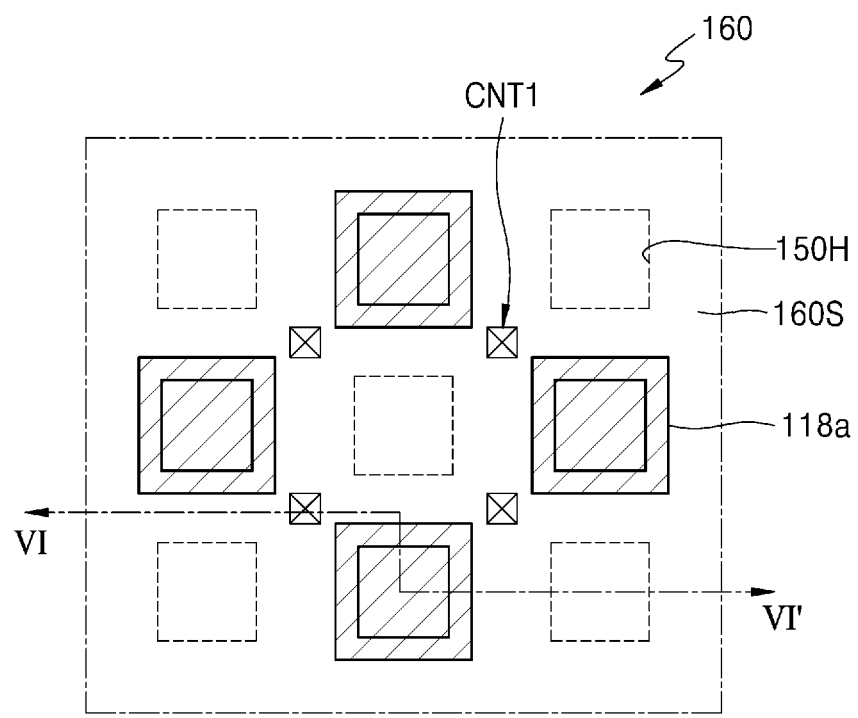
Figure 17:
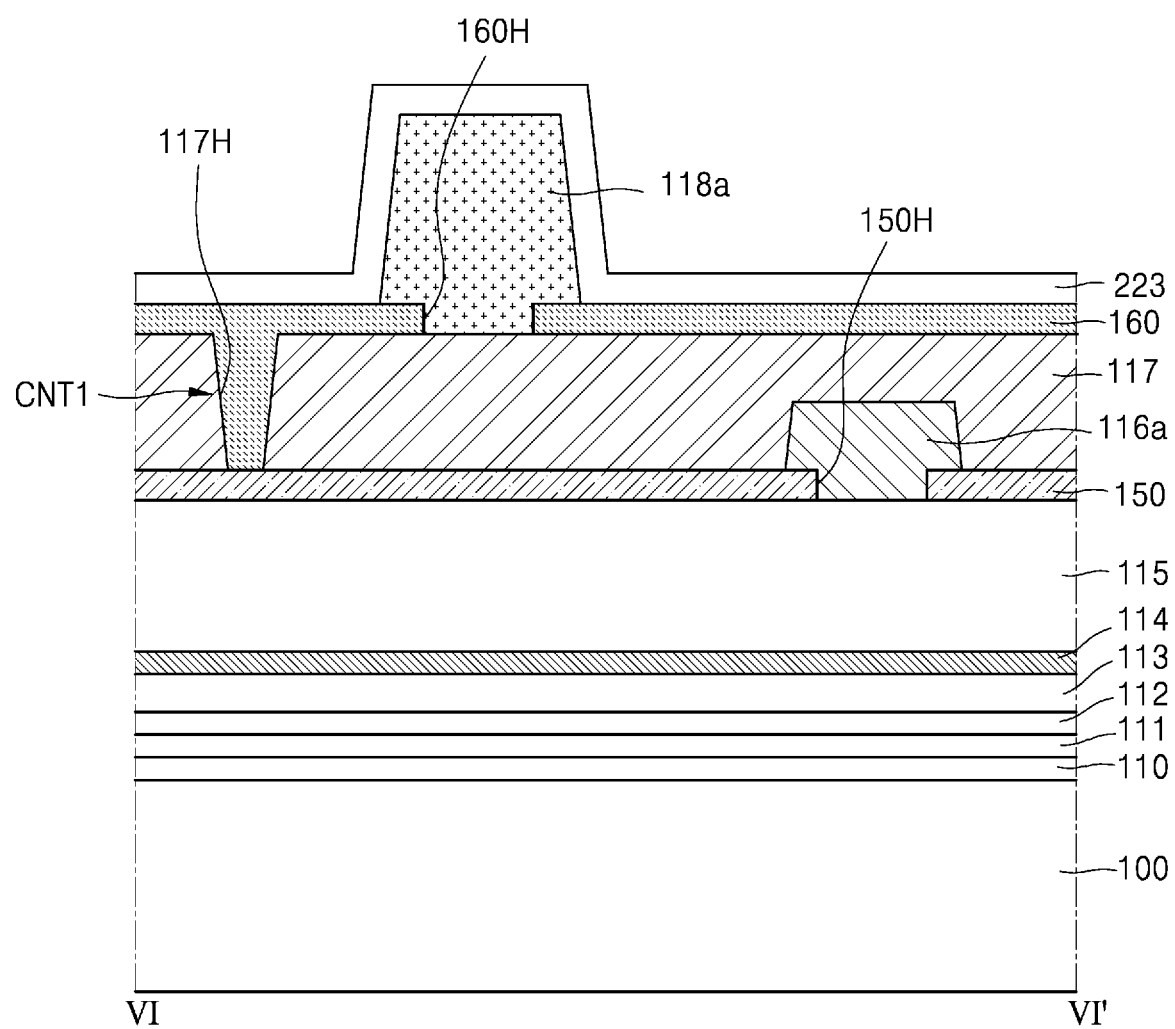
FIG. 17 is a cross-sectional view taken along the line VI-VI' of FIG. 16B.

FIG. 15 is a cross-sectional view of region I of FIG. 4A taken along a second direction, according to some embodiments. FIGS. 16A and 16B are plan views illustrating a stacking relationship between the first conductive layer 150 and the second conductive layer 160 of FIG. 15. FIG. 17 is a cross-sectional view taken along line VI-VI' of FIG. 16B. FIG. 15 may be a cross-sectional view taken along line II-II' of FIG. 6. Hereinafter, the following description will be given with reference to FIGS. 15 to 17, but a description of the same configurations as those of FIGS. 6 to 10B will be omitted.

A first insulating layer 115 arranged in a display area DA may extend to a peripheral area PA and have an opening 115VH in the peripheral area PA. A first conductive layer 150 may be arranged on the first insulating layer 115. The first conductive layer 150 may completely cover the opening 115VH of the first insulating layer 115. The first conductive layer 150 may include a plurality of first holes 150H arranged around the opening 115VH of the first insulating layer 115. As illustrated in FIG. 16A, the first holes 150H may be apart from each other when seen in a plan view. The first holes 150H of the first conductive layer 150 may be covered with a second insulating layer 116 extending from the display area DA to the peripheral area PA.

The second insulating layer 116 may extend from the display area DA to the peripheral area PA and have an opening 116VH overlapping the opening 115VH of the first insulating layer 115 in the peripheral area PA. The second insulating layer 116 may include insulating patterns 116a corresponding to the first holes 150H of the first conductive layer 150. A part of the portion 150S of the first conductive layer 150, which is not covered with the insulating patterns 116a, may be exposed.

A third insulating layer 117 extending from the display area DA to the peripheral area PA may be arranged on the exposed part of the first conductive layer 150 and the insulating patterns 116a. The third insulating layer 117 may cover the exposed part of the first conductive layer 150 and the second insulating layer 116 including the insulating patterns 116a in the peripheral area PA, and may have an opening 117VH overlapping the opening 115VH of the first insulating layer 115 and the opening 116VH of the second insulating layer 116.

The second conductive layer 160 may be arranged on the third insulating layer 117. The second conductive layer 160 may completely cover the opening 116VH of the second insulating layer 116 and the opening 117VH of the third insulating layer 117. The second conductive layer 160 may include a plurality of second holes 160H. As illustrated in FIG. 16B, the second holes 160H may be apart from each other when seen in a plan view. The first hole 150H and the second hole 160H may be offset. That is, the first holes 150H of the first conductive layer 150 and the second holes 160H of the second conductive layer 160 do not overlap each other in the third direction D3, and may be offset in the first direction D1 and the second direction D2 so as to be alternately arranged. The center of the first hole 150H and the center of the second hole 160H may be offset without coinciding with each other.

The second conductive layer 160 may be in contact with the first conductive layer 150 and electrically connected to the first conductive layer 150 in the first contact area CNT1.

As illustrated in FIG. 17, the third insulating layer 117 may include a hole 117H penetrating through the third insulating layer 117 in the first contact area CNT1. The hole 117H of the third insulating layer 117 may be offset without overlapping the first holes 150H of the first conductive layer 150 and the second holes 160H of the second conductive layer 160. The second conductive layer 160 may be in contact with the first conductive layer 150 through the hole 117H of the third insulating layer 117 in the first contact area CNT1.

The second holes 160H of the second conductive layer 160 may be covered with a fourth insulating layer 118 extending from the display area DA to the peripheral area PA. The fourth insulating layer 118 may include insulating patterns 118a corresponding to the second holes 160H of the second conductive layer 160. The insulating pattern 118a of the fourth insulating layer 118 and the insulating pattern 116a of the second insulating layer 116 may be offset without overlapping each other.

The exposed part of the second conductive layer 160, that is, the part of the second conductive layer 160 not covered with the fourth insulating layer 118, may be in direct contact with the second electrode 223 extending from the display area DA to the peripheral area PA.

Figure 18:
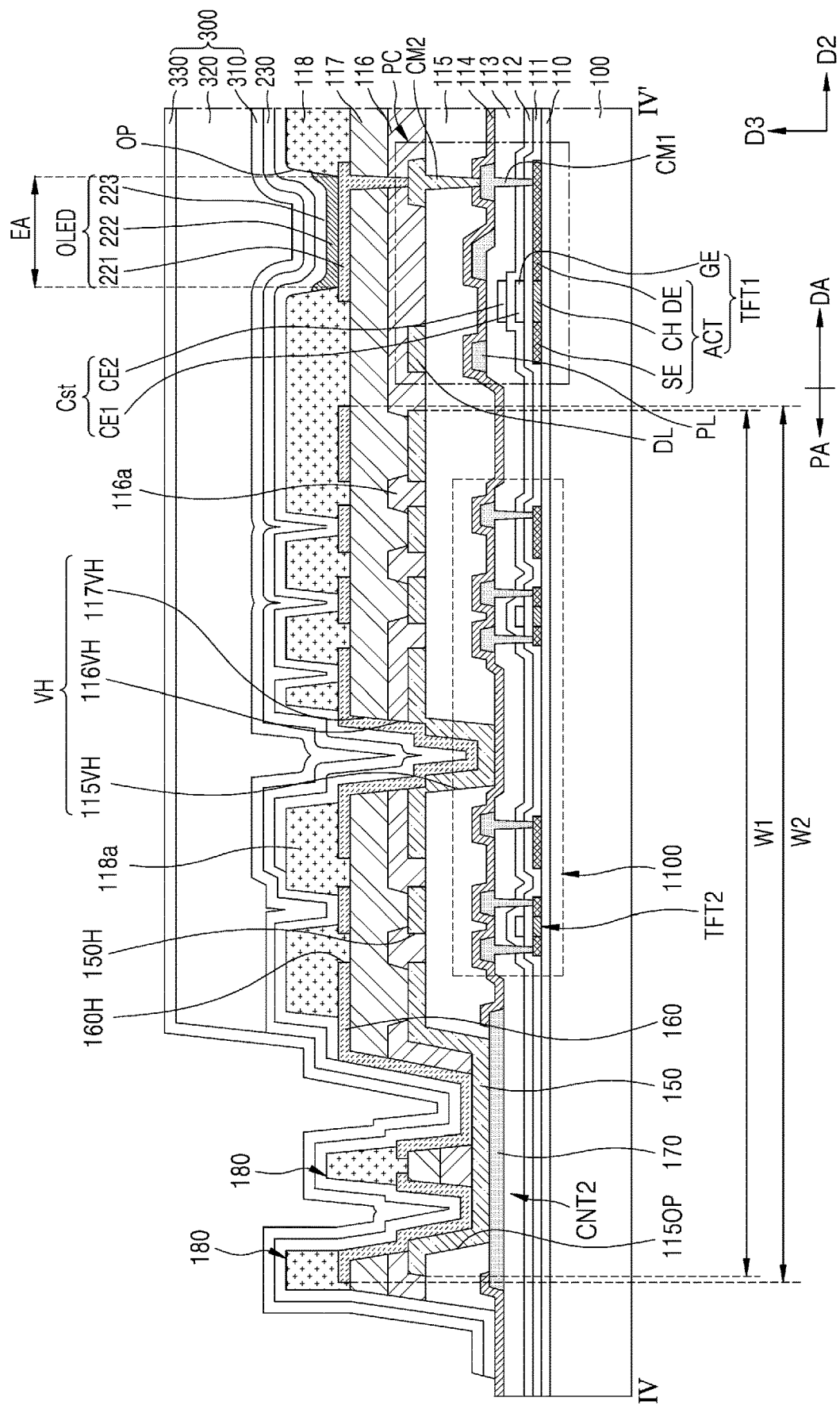
FIG. 18 is a cross-sectional view of the region I of FIG. 4A taken along a second direction, according to some embodiments.
Figure 19A:
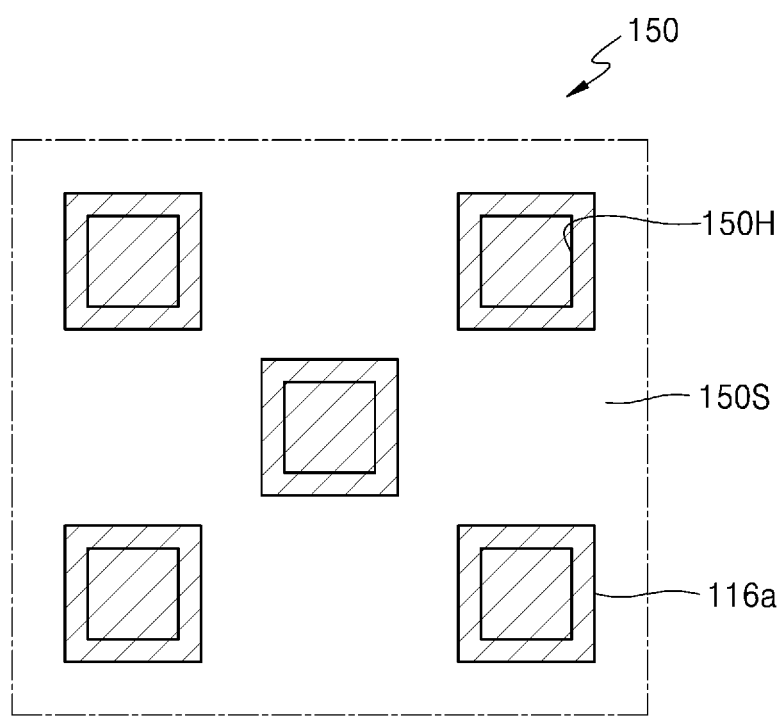
FIGS. 19A and 19B are plan views illustrating a stacking relationship between a first conductive layer and a second conductive layer of FIG. 18.
Figure 19B:
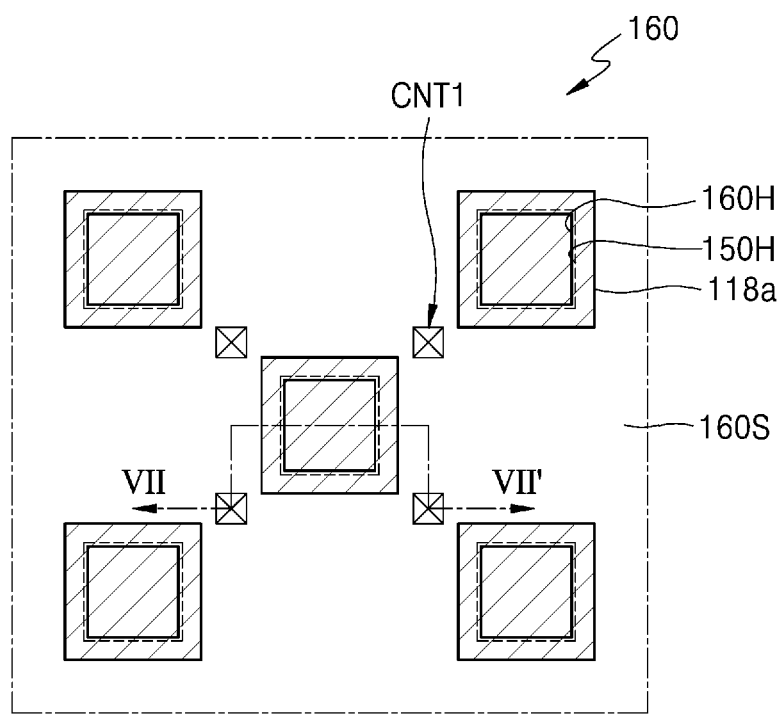
Figure 20:
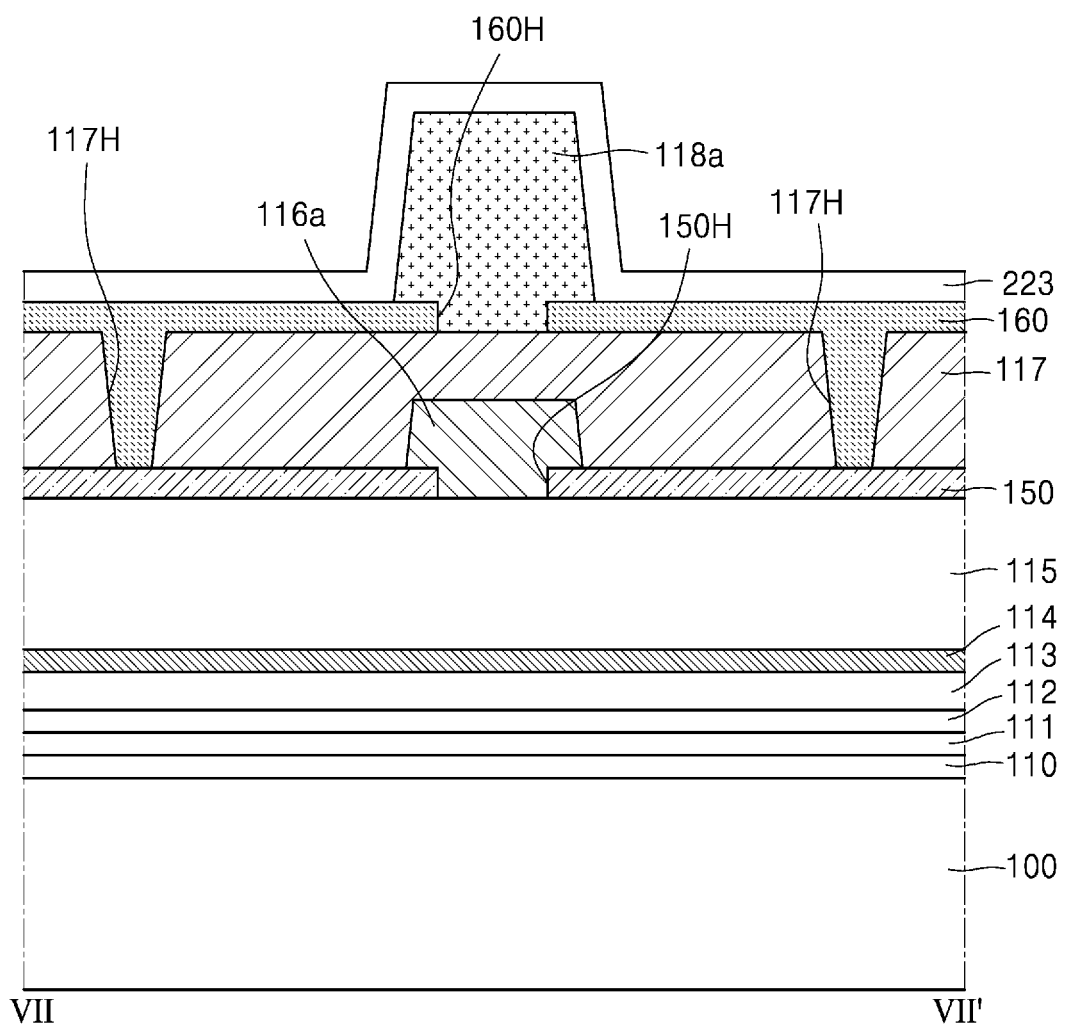
FIG. 20 is a cross-sectional view taken along the line VII-VII' of FIG. 19B.

FIG. 18 is a cross-sectional view of region I of FIG. 4A taken along a second direction, according to some embodiments. FIGS. 19A and 19B are plan views illustrating a stacking relationship between the first conductive layer 150 and the second conductive layer 160 of FIG. 18. FIG. 20 is a cross-sectional view taken along line VII-VII' of FIG. 19B. FIG. 18 may be a cross-sectional view taken along line IV-IV' of FIG. 6. Hereinafter, the following description will be given with reference to FIGS. 18 to 20, but a description of the same configurations as those of FIGS. 11 to 14 will be omitted.

A first insulating layer 115 arranged in a display area DA may extend to a peripheral area PA and have an opening 115VH in the peripheral area PA. A first conductive layer 150 may be arranged on the first insulating layer 115. The first conductive layer 150 may completely cover the opening 115VH of the first insulating layer 115. The first conductive layer 150 may include a plurality of first holes 150H arranged around the opening 115VH of the first insulating layer 115. As illustrated in FIG. 19A, the first holes 150H may be apart from each other when seen in a plan view. The first holes 150H of the first conductive layer 150 may be covered with a second insulating layer 116 extending from the display area DA to the peripheral area PA.

The second insulating layer 116 may extend from the display area DA to the peripheral area PA and have an opening 116VH overlapping the opening 115VH of the first insulating layer 115 in the peripheral area PA. The second insulating layer 116 may include insulating patterns 116a corresponding to the first holes 150H of the first conductive layer 150. A part of the portion 150S of the first conductive layer 150, which is not covered with the insulating patterns 116a, may be exposed.

A third insulating layer 117 extending from the display area DA to the peripheral area PA may be arranged on the exposed part of the first conductive layer 150 and the second insulating layer 116 including the insulating patterns 116a. The third insulating layer 117 may cover the exposed part of the first conductive layer 150 and the second insulating layer 116 in the peripheral area PA, and may have an opening 117VH overlapping the opening 115VH of the first insulating layer 115 and the opening 116VH of the second insulating layer 116.

The second conductive layer 160 may be arranged on the third insulating layer 117. The second conductive layer 160 may completely cover the opening 116VH of the second insulating layer 116 and the opening 117VH of the third insulating layer 117. The second conductive layer 160 may include a plurality of second holes 160H. As illustrated in FIG. 19B, the second holes 160H may be apart from each other when seen in a plan view. The second holes 160H may overlap the first holes 150H when seen in a cross-sectional view and a plan view. That is, the center of the first hole 150H and the center of the second hole 160H may coincide with each other. The second hole 160H may overlap the insulating pattern 116a.

The second conductive layer 160 may be in contact with the first conductive layer 150 and electrically connected to the first conductive layer 150 in the first contact area CNT1. As illustrated in FIG. 20, the third insulating layer 117 may include a hole 117H penetrating through the third insulating layer 117 and exposing the portion 150S of the first conductive layer 150 in the first contact area CNT1. The hole 117H of the third insulating layer 117 may be offset without overlapping the first holes 150H of the first conductive layer 150 and the second holes 160H of the second conductive layer 160. The second conductive layer 160 may be in contact with the first conductive layer 150 through the hole 117H of the third insulating layer 117 in the first contact area CNT1.

The second holes 160H of the second conductive layer 160 may be covered with a fourth insulating layer 118 extending from the display area DA to the peripheral area PA. The fourth insulating layer 118 may include island-shaped insulating patterns 118a corresponding to the second holes 160H of the second conductive layer 160. The insulating pattern 118a of the fourth insulating layer 118 may overlap the insulating pattern 116a of the second insulating layer 116.

The exposed part of the second conductive layer 160, that is, the part of the second conductive layer 160 not covered with the fourth insulating layer 118, may be in direct contact with the second electrode 223 extending from the display area DA to the peripheral area PA.

Figure 21:
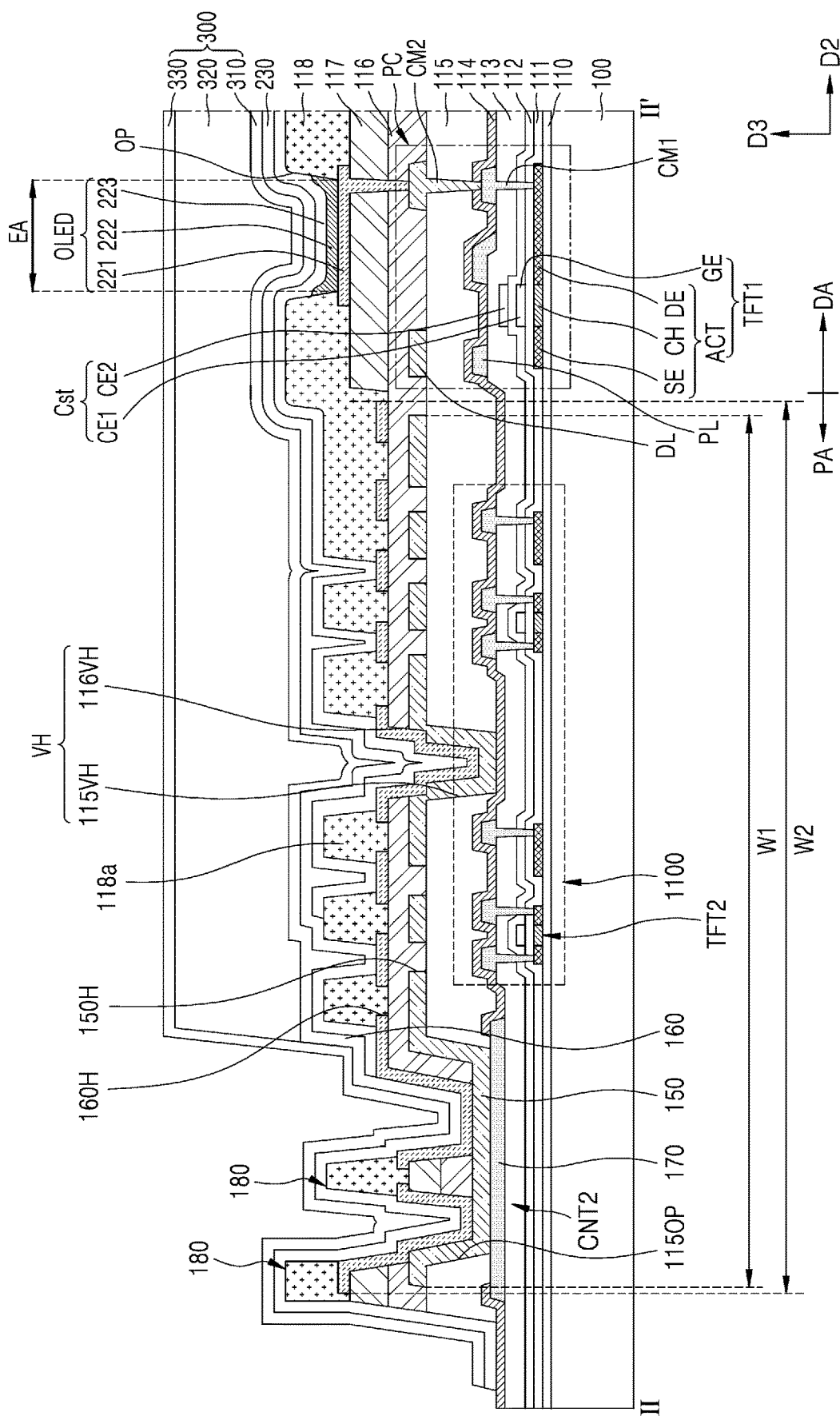
FIG. 21 is a cross-sectional view of region I of FIG. 4A taken along a second direction, according to some embodiments.
Figure 22A:
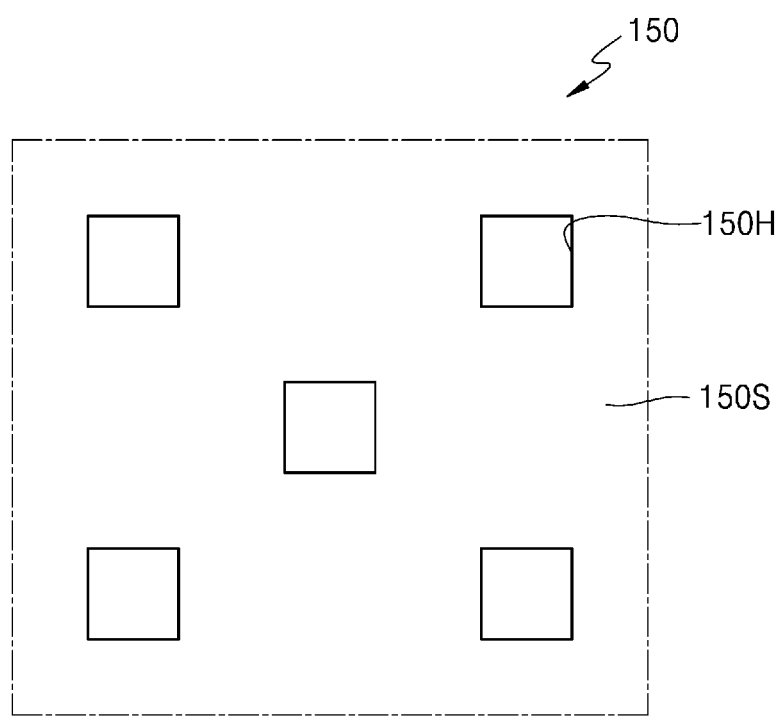
FIGS. 22A and 22B are plan views illustrating a stacking relationship between a first conductive layer and a second conductive layer of FIG. 21.
Figure 22B:
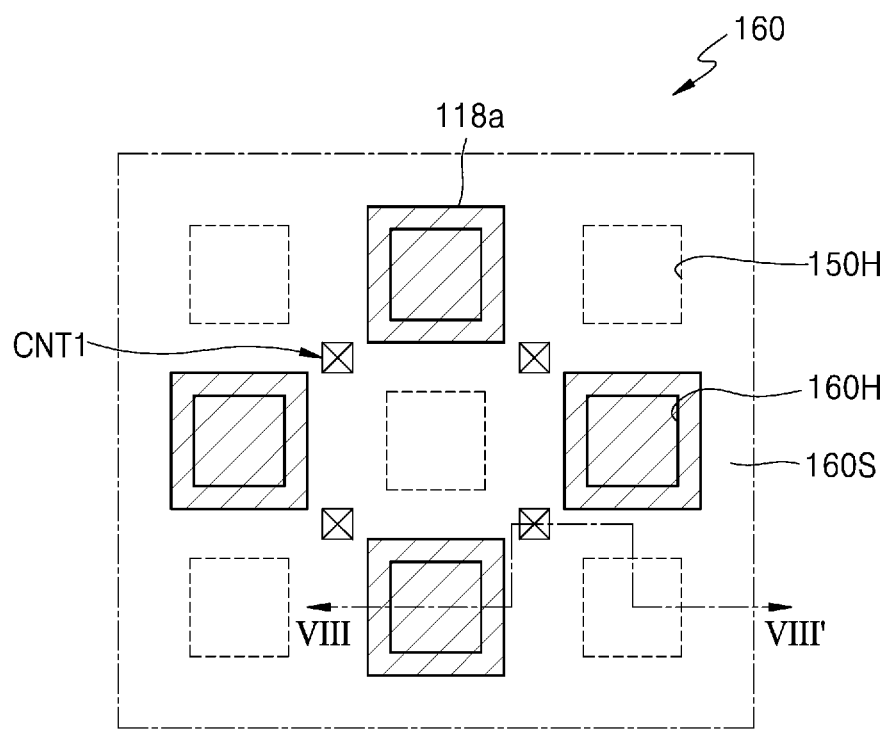
Figure 23:
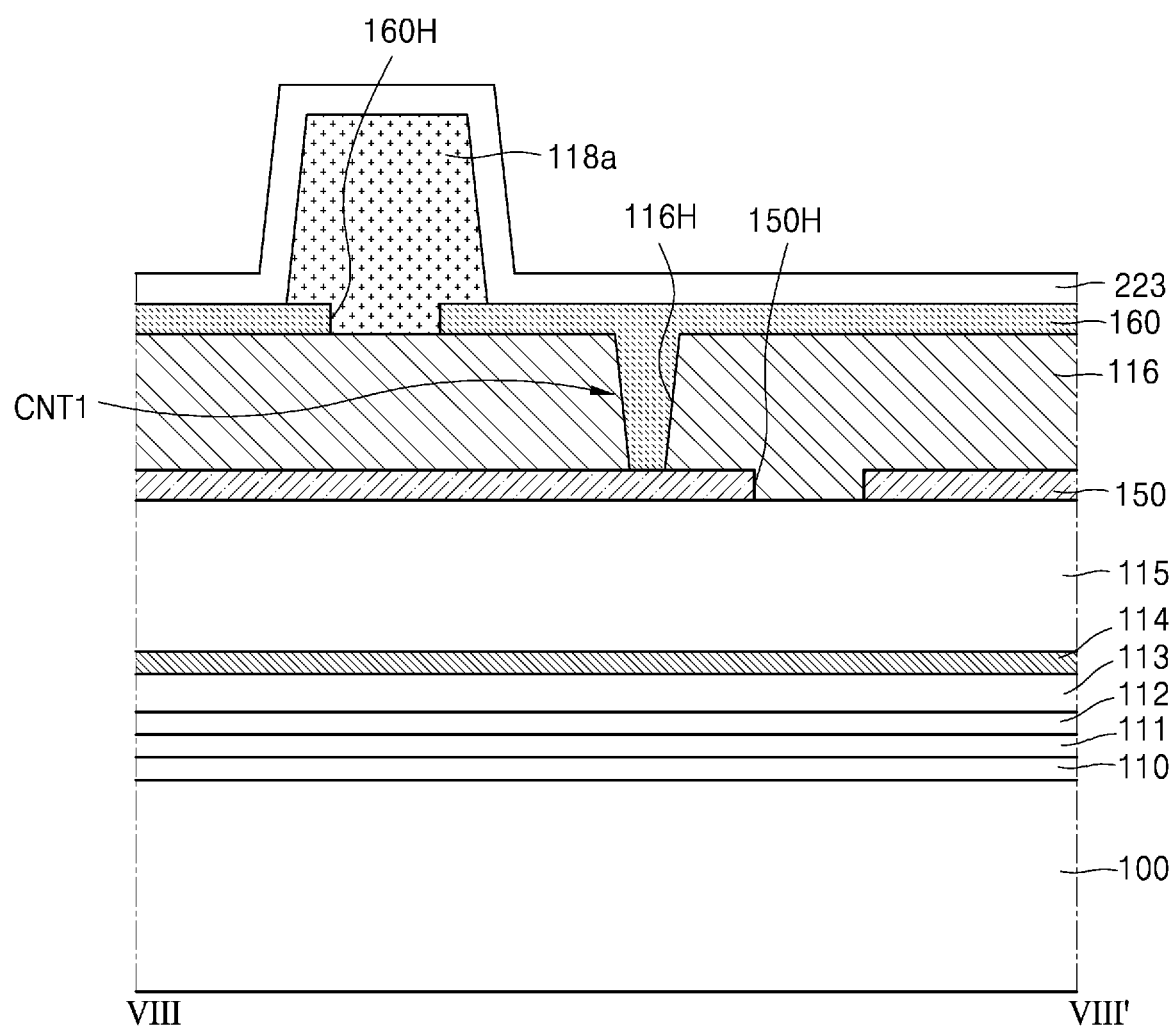
FIG. 23 is a cross-sectional view taken along the line VIII-VIII' of FIG. 22B.

FIG. 21 is a cross-sectional view of region I of FIG. 4A taken along a second direction, according to some embodiments. FIGS. 22A and 22B are plan views illustrating a stacking relationship between the first conductive layer 150 and the second conductive layer 160 of FIG. 21. FIG. 23 is a cross-sectional view taken along line VIII-VIII' of FIG. 22B. FIG. 21 may be a cross-sectional view taken along line II-II' of FIG. 6. Hereinafter, the following description will be given with reference to FIGS. 21 to 23, but a description of the same configurations as those of FIGS. 6 to 10B will be omitted.

A first insulating layer 115 arranged in a display area DA may extend to a peripheral area PA and have an opening 115VH in the peripheral area PA. A first conductive layer 150 may be arranged on the first insulating layer 115. The first conductive layer 150 may include a plurality of first holes 150H arranged around the opening 115VH. As illustrated in FIG. 22A, the first holes 150H may be apart from each other when seen in a plan view.

A second insulating layer 116 covering the first holes 150H of the first conductive layer 150 and extending from the display area DA to the peripheral area PA may be arranged above the first conductive layer 150. The second insulating layer 116 may include an opening 116VH overlapping the opening 115VH of the first insulating layer 115.

The second conductive layer 160 may be arranged on the second insulating layer 116. The second conductive layer 160 may completely cover the opening 116VH of the second insulating layer 116. The second conductive layer 160 may include a plurality of second holes 160H of the second insulating layer 116. As illustrated in FIG. 22B, the second holes 160H may be apart from each other when seen in a plan view. The first hole 150H and the second hole 160H may be offset from each other. That is, the first holes 150H of the first conductive layer 150 and the second holes 160H of the second conductive layer 160 do not overlap each other in the third direction D3, and may be offset in the first direction D1 and the second direction D2 so as to be alternately arranged. The center of the first hole 150H and the center of the second hole 160H may be offset from each other without coinciding with each other.

The second conductive layer 160 may be in contact with the first conductive layer 150 and electrically connected to the first conductive layer 150 in the first contact area CNT1. As illustrated in FIG. 23, the second insulating layer 116 may include a hole 116H penetrating through the second insulating layer 116 and exposing the first conductive layer 150 in the first contact area CNT1. The second conductive layer 160 may be in contact with the first conductive layer 150 through the hole 116H of the second insulating layer 116 in the first contact area CNT1.

The second holes 160H of the second conductive layer 160 may be covered with a fourth insulating layer 118 extending from the display area DA to the peripheral area PA. The fourth insulating layer 118 may include insulating patterns 118a corresponding to the second holes 160H of the second conductive layer 160. The exposed part of the second conductive layer 160, that is, the part of the second conductive layer 160 not covered with the fourth insulating layer 118, may be in direct contact with the second electrode 223 extending from the display area DA to the peripheral area PA.

Figure 24:
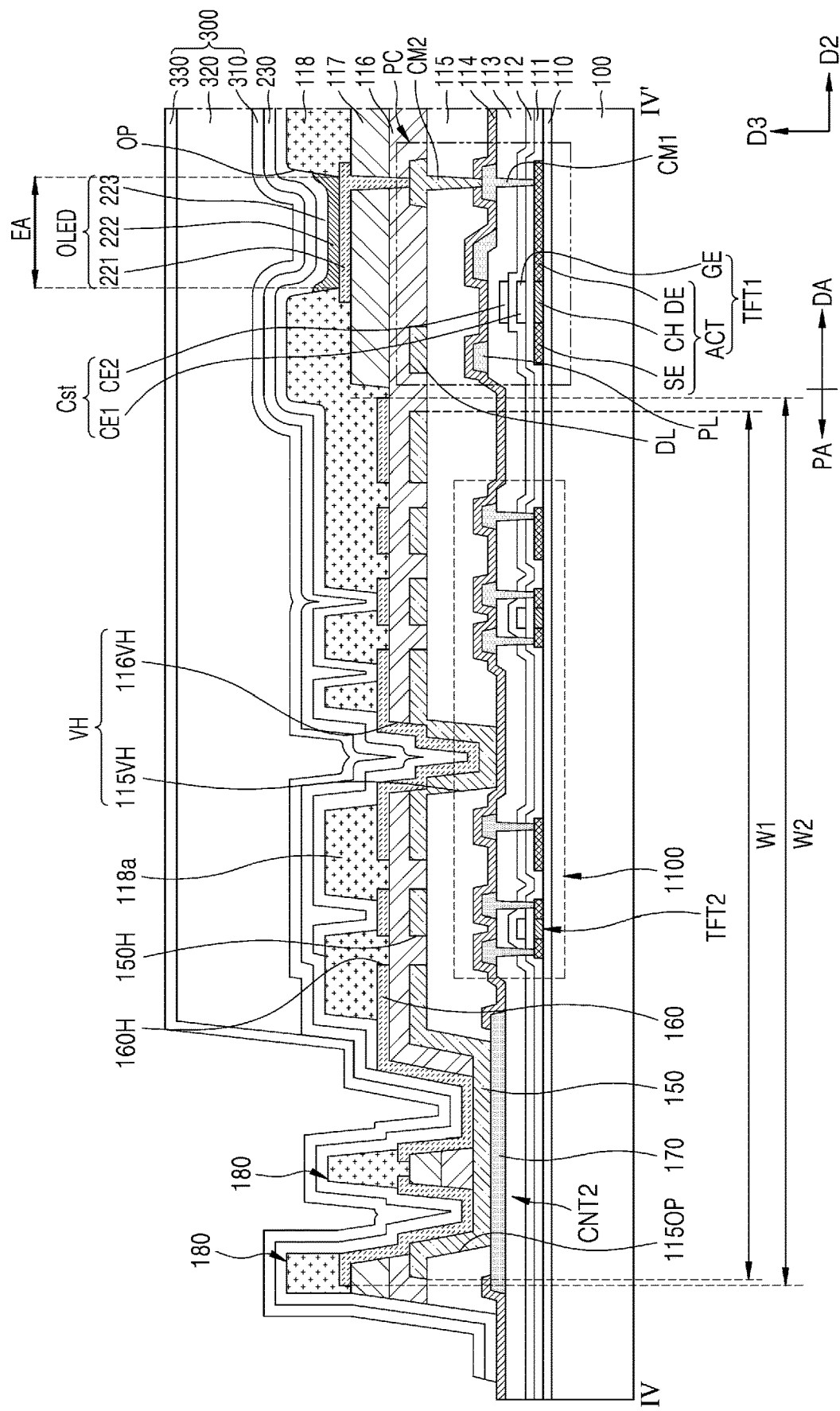
FIG. 24 is a cross-sectional view of region I of FIG. 4A taken along a second direction, according to some embodiments.
Figure 25A:
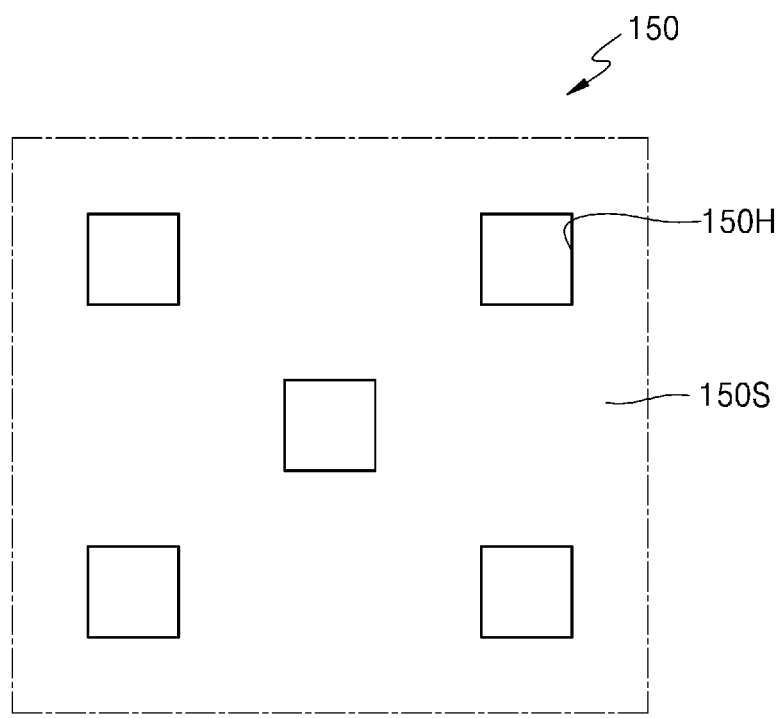
FIGS. 25A and 25B are plan views illustrating a stacking relationship between a first conductive layer and a second conductive layer of FIG. 24.
Figure 25B:
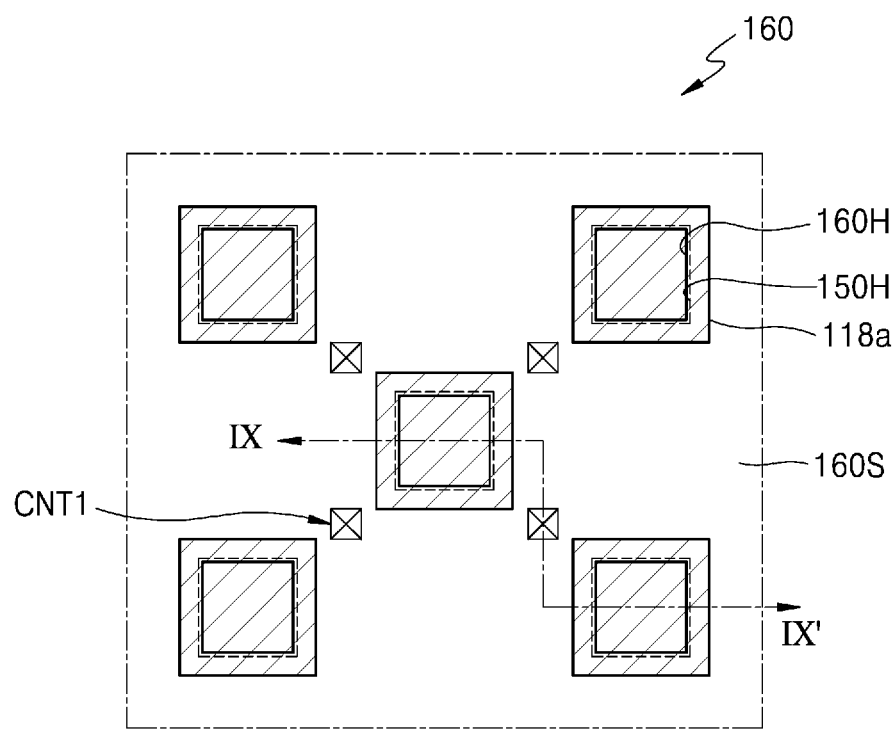
Figure 26:
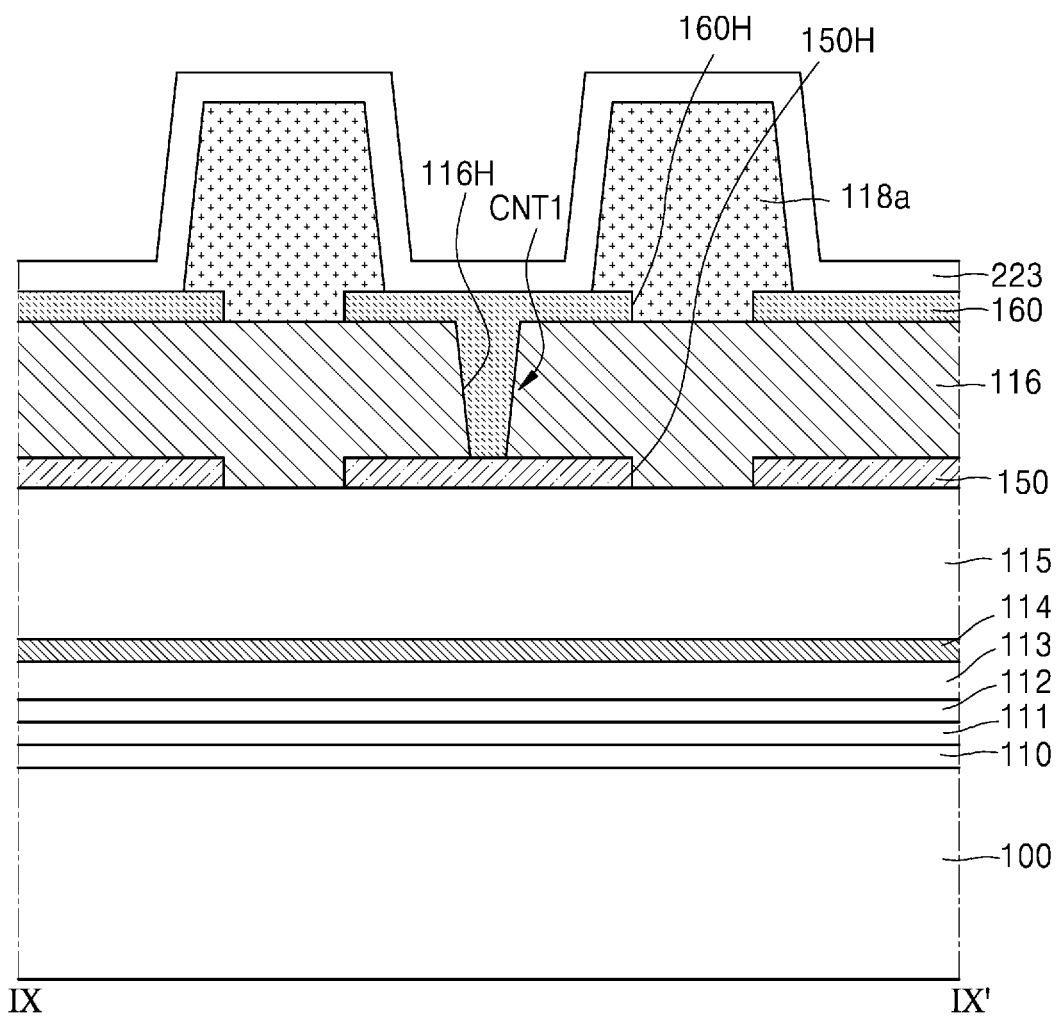
FIG. 26 is a cross-sectional view taken along the line IX-IX' of FIG. 25B.

FIG. 24 is a cross-sectional view of region I of FIG. 4A taken along a second direction, according to some embodiments. FIGS. 25A and 25B are plan views illustrating a stacking relationship between the first conductive layer 150 and the second conductive layer 160 of FIG. 24. FIG. 26 is a cross-sectional view taken along line IX-IX' of FIG. 25B. FIG. 24 may be a cross-sectional view taken along line IV-IV' of FIG. 11. Hereinafter, the following description will be given with reference to FIGS. 24 to 26, but a description of the same configurations as those of FIGS. 11 to 14 will be omitted.

A first insulating layer 115 arranged in a display area DA may extend to a peripheral area PA and have an opening 115VH in the peripheral area PA. A first conductive layer 150 may be arranged on the first insulating layer 115. The first conductive layer 150 may include a plurality of first holes 150H. As illustrated in FIG. 25A, the first holes 150H may be apart from each other when seen in a plan view.

A second insulating layer 116 covering the first holes 150H of the first conductive layer 150 and extending from the display area DA to the peripheral area PA may be arranged above the first conductive layer 150. The second conductive layer 160 may be arranged on the second insulating layer 116. The second conductive layer 160 may include a plurality of second holes 160H. As illustrated in FIG. 25B, the second holes 160H may be apart from each other when seen in a plan view. The second holes 160H may overlap the first holes 150H when seen in a cross-sectional view and a plan view. That is, the center of the first hole 150H and the center of the second hole 160H may coincide with each other.

The second conductive layer 160 may be in contact with the first conductive layer 150 and electrically connected to the first conductive layer 150 in the first contact area CNT1. As illustrated in FIG. 26, the second insulating layer 116 may include a hole 116H penetrating through the second insulating layer 116 and exposing the first conductive layer 150 in the first contact area CNT1. The second conductive layer 160 may be in contact with the first conductive layer 150 through the hole 116H of the second insulating layer 116 in the first contact area CNT1.

The second holes 160H of the second conductive layer 160 may be covered with a fourth insulating layer 118 extending from the display area DA to the peripheral area PA. The fourth insulating layer 118 may include insulating patterns 118a corresponding to the second holes 160H of the second conductive layer 160. The exposed part of the second conductive layer 160, that is, the part of the second conductive layer 160 not covered with the fourth insulating layer 118, may be in direct contact with the second electrode 223 extending from the display area DA to the peripheral area PA.

Figure 27:
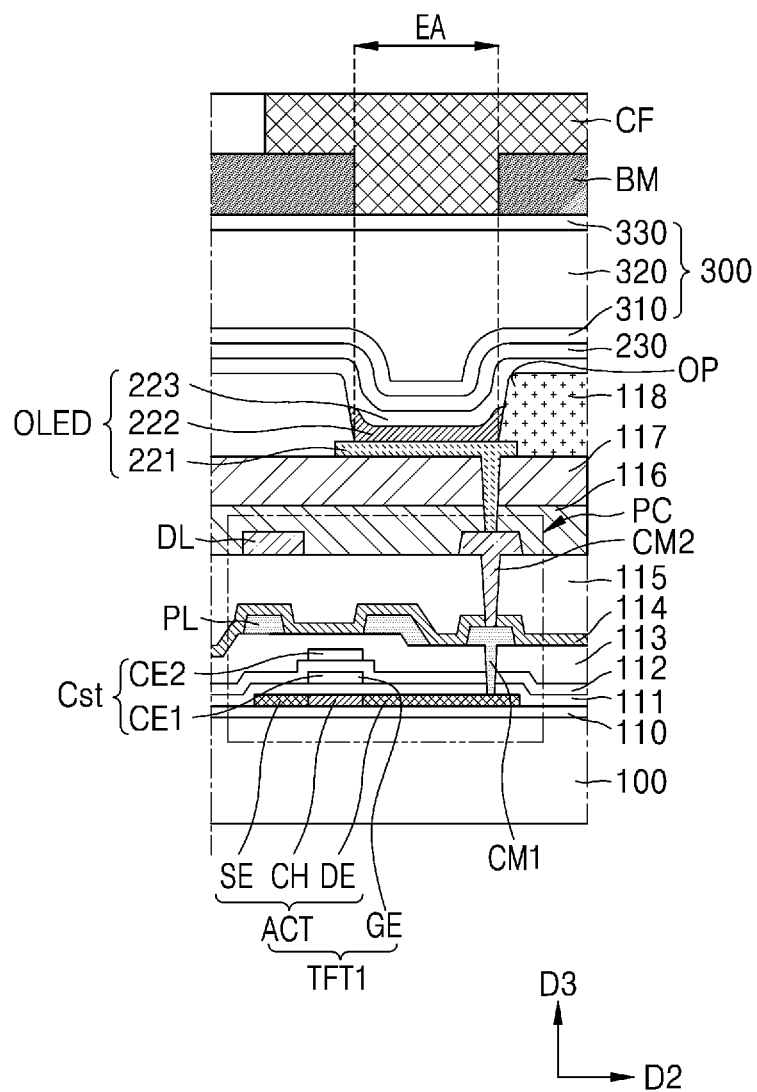
FIG. 27 is a cross-sectional view schematically illustrating a display apparatus according to some embodiments.
Figure 28:
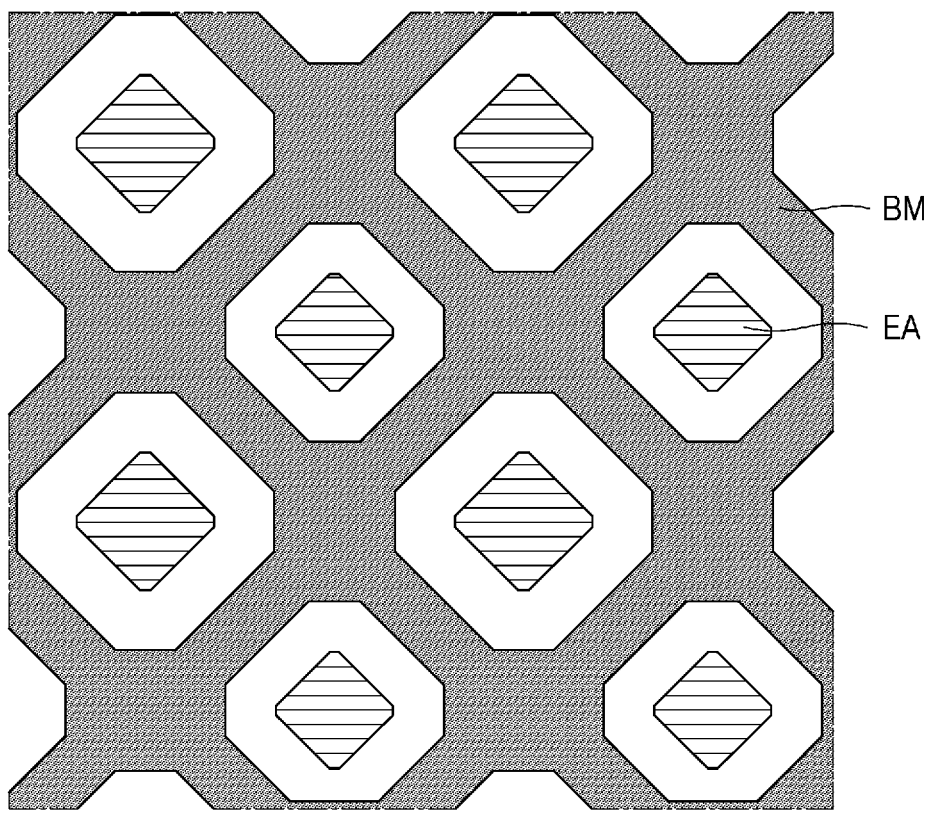
FIG. 28 is a diagram illustrating a relationship between a black matrix and an emission area of FIG. 27.
Figure 29:
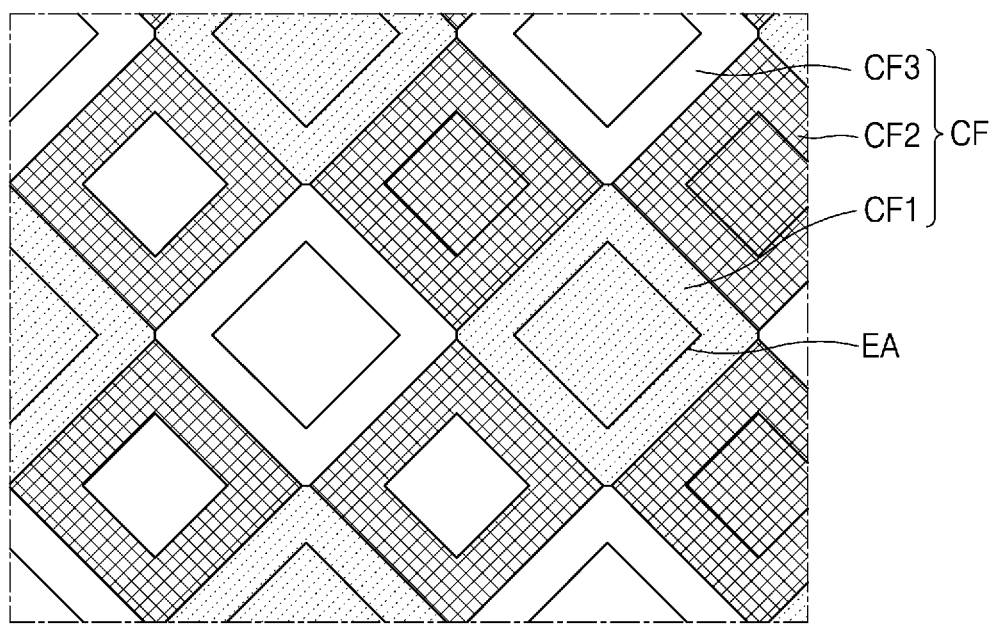
FIG. 29 is a diagram illustrating a relationship between a color filter and an emission area of FIG. 27.

FIG. 27 is a cross-sectional view schematically illustrating a display apparatus according to some embodiments, FIG. 28 is a diagram illustrating a relationship between a black matrix BM and an emission area EA of FIG. 27, and FIG. 29 is a diagram illustrating a relationship between a color filter CF and the emission area EA of FIG. 27.

Referring to FIG. 27, the black matrix BM and the color filter CF serving as an optical function layer may be arranged on an encapsulation layer 300. As illustrated in FIG. 28, the black matrix BM may surround the emission area EA and may be arranged corresponding to an area other than an opening OP of a fourth insulating layer 118. As illustrated in FIG. 29, the color filter CF may be arranged corresponding to at least the emission area EA. The color filter CF may include a first color filter CF1 that selectively transmits only light of a first color, a second color filter CF2 that selectively transmits only light of a second color, and a third color filter CF3 that selectively transmits only light of a third color. The first color filter CF1, the second color filter CF2, and the third color filter CF3 may be adjacent to each other and arranged in a certain pattern. The black matrix BM may be arranged corresponding to the boundary of the first color filter CF1, the second color filter CF2, and the third color filter CF3. The first color filter CF1, the second color filter CF2, and the third color filter CF3 may each partially overlap the black matrix BM.

Although not illustrated, an input sensing layer may be further provided between the black matrix BM and the encapsulation layer 300 and between color filter CF and the encapsulation layer 300.

When impurities are introduced from the outside or impurities such as gases or moisture generated in the organic material included in the display apparatus penetrate into the display apparatus, image quality may be deteriorated during the manufacturing process or in use. According to one or more embodiments, it is possible to provide display apparatuses capable of solving or reducing various problems including the above-described problem by preventing or reducing deterioration in image quality of an implemented image.

According to one or more embodiments, it may be possible to implement display apparatuses capable of preventing or reducing deterioration in image quality during the manufacturing process or in use. The scope of the disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display apparatus comprising:
a substrate comprising a display area and a peripheral area outside the display area;
a first conductive layer on the substrate in the peripheral area and comprising a first hole;
a second conductive layer on the first conductive layer and overlapping the first conductive layer in the peripheral area, the second conductive layer comprising a second hole;
a planarization layer extending from the display area to the peripheral area and comprising at least two organic insulating layers between the first conductive layer and the second conductive layer; and
a display element on the planarization layer in the display area,
wherein a part of a portion of the second conductive layer except for the second hole is in contact with a part of a portion of the first conductive layer except for the first hole.

2. The display apparatus of claim 1, wherein the planarization layer comprises a first organic insulating layer comprising a third hole, and a second organic insulating layer on the first organic insulating layer and comprising a fourth hole, wherein the second hole of the second conductive layer is offset from the first hole of the first conductive layer,
the third hole of the first organic insulating layer and the fourth hole of the second organic insulating layer are offset from the first hole of the first conductive layer and the second hole of the second conductive layer, and
the second conductive layer is in contact with the first conductive layer where the third hole of the first organic insulating layer overlaps the fourth hole of the second organic insulating layer.

3. The display apparatus of claim 2, wherein a size of the third hole of the first organic insulating layer is different from a size of the fourth hole of the second organic insulating layer.

4. The display apparatus of claim 1, wherein the planarization layer comprises a first organic insulating layer comprising an insulating pattern overlapping the first hole of the first conductive layer, and a second organic insulating layer on the first organic insulating layer,
the second organic insulating layer comprises a fourth hole offset from the first hole of the first conductive layer and the second hole of the second conductive layer, the fourth hole being arranged around the insulating pattern of the first organic insulating layer,
the second hole of the second conductive layer is offset from the first hole of the first conductive layer, and
the second conductive layer is in contact with the first conductive layer at a position of the fourth hole of the second organic insulating layer.

5. The display apparatus of claim 1, wherein the planarization layer comprises a first organic insulating layer comprising an insulating pattern overlapping the first hole of the first conductive layer, and a second organic insulating layer on the first organic insulating layer,
the second organic insulating layer comprises a fourth hole offset from the first hole of the first conductive layer and the second hole of the second conductive layer, the fourth hole being arranged around the insulating pattern of the first organic insulating layer,
the second hole of the second conductive layer overlaps the first hole of the first conductive layer, and
the second conductive layer is in contact with the first conductive layer at the fourth hole of the second organic insulating layer.

6. The display apparatus of claim 1, wherein the display element comprises a first electrode on a same layer as the second conductive layer, a second electrode facing the first electrode, and an emission layer between the first electrode and the second electrode, and
the second electrode extends to the peripheral area.

7. The display apparatus of claim 6, further comprising an insulating layer covering an edge of the first electrode of the display element in the display area and comprising an insulating pattern overlapping the second hole of the second conductive layer in the peripheral area,
wherein the second electrode of the display element is in contact with the second conductive layer.

8. The display apparatus of claim 6, further comprising a thin-film transistor electrically connected to the first electrode of the display element in the display area; and
a power supply line in an area between an end portion of the second electrode of the display element and an edge of the substrate in the peripheral area,
wherein an end portion of the first conductive layer is in contact with the power supply line, and an end portion of the second conductive layer is in contact with the end portion of the first conductive layer.

9. The display apparatus of claim 1, wherein a window above the substrate and the display element is flexible so that the display area is folded or curved.

10. The display apparatus of claim 1, wherein the planarization layer comprises a first organic insulating layer comprising a first organic material, and a second organic insulating layer comprising a second organic material that is different from the first organic material.

11. A display apparatus comprising:
a substrate comprising a display area and a peripheral area outside the display area;
a first conductive layer on the substrate in the peripheral area and comprising a first hole;
a second conductive layer on the first conductive layer and overlapping the first conductive layer in the peripheral area, the second conductive layer comprising a second hole;
a first organic insulating layer extending from the display area to the peripheral area and arranged between the first conductive layer and the second conductive layer in the peripheral area;
a second organic insulating layer on the first organic insulating layer, wherein a portion of the second organic insulating layer in the peripheral area is removed; and
a display element on the second organic insulating layer in the display area, wherein a part of a portion of the second conductive layer except for the second hole is in contact with a part of a portion of the first conductive layer except for the first hole.

12. The display apparatus of claim 11, wherein the second hole of the second conductive layer overlaps the first hole of the first conductive layer,
the first organic insulating layer comprises an insulating pattern overlapping the first hole of the first conductive layer, and
the second conductive layer is in contact with a portion of the first conductive layer that is not covered with the insulating pattern of the first organic insulating layer.

13. The display apparatus of claim 11, wherein the second hole of the second conductive layer is offset from the first hole of the first conductive layer,
the first organic insulating layer comprises a third hole that is offset from the first hole of the first conductive layer and the second hole of the second conductive layer, and
the second conductive layer is in contact with the first conductive layer at a position of the third hole of the first organic insulating layer.

14. The display apparatus of claim 11, wherein the second hole of the second conductive layer overlaps the first hole of the first conductive layer,
the first organic insulating layer comprises a third hole that is offset from the first hole of the first conductive layer and the second hole of the second conductive layer, and
the second conductive layer is in contact with the first conductive layer at a position of the third hole of the first organic insulating layer.

15. The display apparatus of claim 11, wherein the display element comprises a first electrode on the second organic insulating layer, and a second electrode facing the first electrode and extending to the peripheral area.

16. The display apparatus of claim 15, further comprising an insulating layer covering an edge of the first electrode of the display element in the display area and comprising an insulating pattern overlapping the second hole of the second conductive layer in the peripheral area,
wherein the second electrode of the display element is in contact with the second conductive layer.

17. The display apparatus of claim 15, further comprising a power supply line between an end portion of the second electrode and an edge of the substrate,
wherein an end portion of the first conductive layer is in contact with the power supply line, and an end portion of the second conductive layer is in contact with the end portion of the first conductive layer.

18. The display apparatus of claim 11, wherein a window above the substrate and the display element is flexible so that the display area is folded or curved.

19. The display apparatus of claim 11, wherein the first organic insulating layer comprises a first organic material, and
the second organic insulating layer comprises a second organic material that is different from the first organic material.

20. A display apparatus comprising:
a substrate comprising a display area and a peripheral area outside the display area;
a first organic insulating layer on the substrate in the display area and the peripheral area;
a first conductive layer on the first organic insulating layer in the peripheral area and comprising a plurality of first holes;
a second organic insulating layer covering the first conductive layer and on the first organic insulating layer;
a third organic insulating layer on the second organic insulating layer;
a second conductive layer on the third organic insulating layer in the peripheral area and comprising a plurality of second holes, centers of the plurality of second holes of the second conductive layer being offset from centers of the plurality of first holes of the first conductive layer; and
a display element on the third organic insulating layer in the display area.

* * * * *